United States Patent
Moomey

(10) Patent No.: US 8,699,743 B2
(45) Date of Patent: Apr. 15, 2014

(54) SPEAKER SYSTEM AND AMPLIFIER

(75) Inventor: Charles Edward Moomey, Franklin, TN (US)

(73) Assignee: 3rd Power Amplication, Franklin, TN (US)

( * ) Notice: Subject to any disclaimer, the term of this patent is extended or adjusted under 35 U.S.C. 154(b) by 6912 days.

(21) Appl. No.: 12/838,102

(22) Filed: Jul. 16, 2010

(65) Prior Publication Data

US 2011/0013782 A1 Jan. 20, 2011

Related U.S. Application Data

(60) Provisional application No. 61/226,184, filed on Jul. 16, 2009.

(51) Int. Cl.
*H04R 1/02* (2006.01)

(52) U.S. Cl.
USPC ............ 381/386; 381/345; 381/354; 381/423

(58) Field of Classification Search
None
See application file for complete search history.

(56) References Cited

U.S. PATENT DOCUMENTS

| | | | | |
|---|---|---|---|---|
| 3,608,665 A * | 9/1971 | Drisi | ............................ | 181/150 |
| 3,923,124 A | 12/1975 | Hancock | | |
| 4,014,597 A * | 3/1977 | Griffin, Jr. | ...................... | 312/7.1 |
| 4,179,585 A * | 12/1979 | Herrenschmidt | ............. | 381/182 |
| 4,280,586 A | 7/1981 | Petersen | | |
| 4,348,552 A * | 9/1982 | Siccone | ........................ | 381/99 |
| 4,418,243 A * | 11/1983 | Fixler | ............................ | 381/308 |
| 4,730,694 A | 3/1988 | Albarino | | |
| 4,768,086 A | 8/1988 | Paist | | |
| 5,097,514 A | 3/1992 | McNeill | | |
| 5,105,906 A * | 4/1992 | Wegner | ........................ | 181/156 |
| 5,436,976 A * | 7/1995 | Dougherty | .................... | 381/387 |
| 5,590,771 A * | 1/1997 | Cota | ............................. | 206/314 |
| 5,907,622 A | 5/1999 | Dougherty | | |
| 6,721,431 B1 * | 4/2004 | Johnson | ........................ | 381/336 |
| 6,813,362 B2 * | 11/2004 | Bank et al. | ..................... | 381/152 |
| 7,233,677 B2 * | 6/2007 | Moore | ........................ | 381/341 |
| 8,036,410 B2 * | 10/2011 | Koren et al. | ................... | 381/345 |
| 8,050,425 B2 * | 11/2011 | Iwamatsu | ....................... | 381/98 |
| 2002/0118853 A1 * | 8/2002 | Flentje | .......................... | 381/336 |
| 2002/0172393 A1 * | 11/2002 | Bank et al. | ..................... | 381/431 |

(Continued)

FOREIGN PATENT DOCUMENTS

JP 04-345297 A 12/1992

OTHER PUBLICATIONS

International Search Report and Written Opinion of PCT/US2010/042314 mailed on Feb. 25, 2011, 15 pages.

*Primary Examiner* — Marlo Fletcher
(74) *Attorney, Agent, or Firm* — Kilpatrick Townsend & Stockton LLP

(57) ABSTRACT

A system and methods for implementing substantially triangular or trapezoidal speaker enclosures and related components. A speaker enclosure may be shaped substantially as an equilateral triangle, loaded with three speakers mounted radially equidistant from the planar center of the triangular enclosure. The speaker enclosure may comprise a triangular port with a detachable lid. A speaker enclosure also may be shaped substantially as a box with an interior triangular subchamber. The speaker enclosures may further include an amplifier system having a novel input gain stage or a novel tone stack, or both. An amplifier system also may comprise parallel audio input processing through input gain modules and tone stack modules, with the separate audio signals summed by a novel mixdown module.

26 Claims, 23 Drawing Sheets

(56) References Cited

U.S. PATENT DOCUMENTS

| | | |
|---|---|---|
| 2003/0091206 A1 | 5/2003 | Proni |
| 2003/0231782 A1* | 12/2003 | Engebretson et al. ........ 381/182 |
| 2005/0084126 A1* | 4/2005 | Milton .......................... 381/336 |
| 2005/0276431 A1* | 12/2005 | Moore .......................... 381/340 |
| 2006/0133625 A1* | 6/2006 | Adams et al. ................. 381/120 |
| 2007/0258617 A1* | 11/2007 | Henry .......................... 381/423 |
| 2008/0089543 A1* | 4/2008 | Nakamura et al. ............ 381/338 |
| 2008/0192964 A1* | 8/2008 | Iwayama ...................... 381/182 |
| 2010/0329484 A1* | 12/2010 | Adams et al. ................. 381/120 |
| 2011/0013782 A1* | 1/2011 | Moomey ......................... 381/87 |

* cited by examiner

34 Rubber Feet    60 Locking Attachment

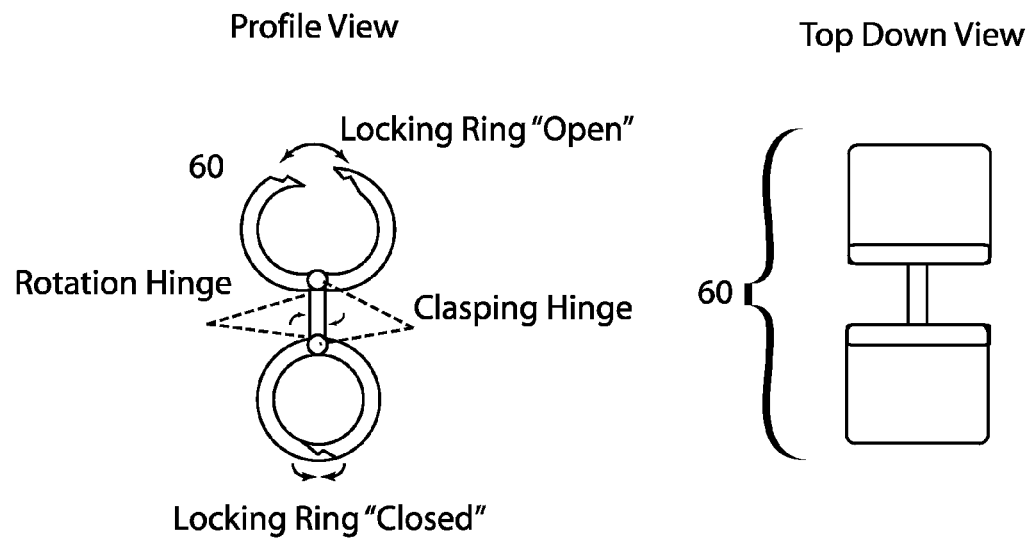
FIG. 6C
FIG. 6D
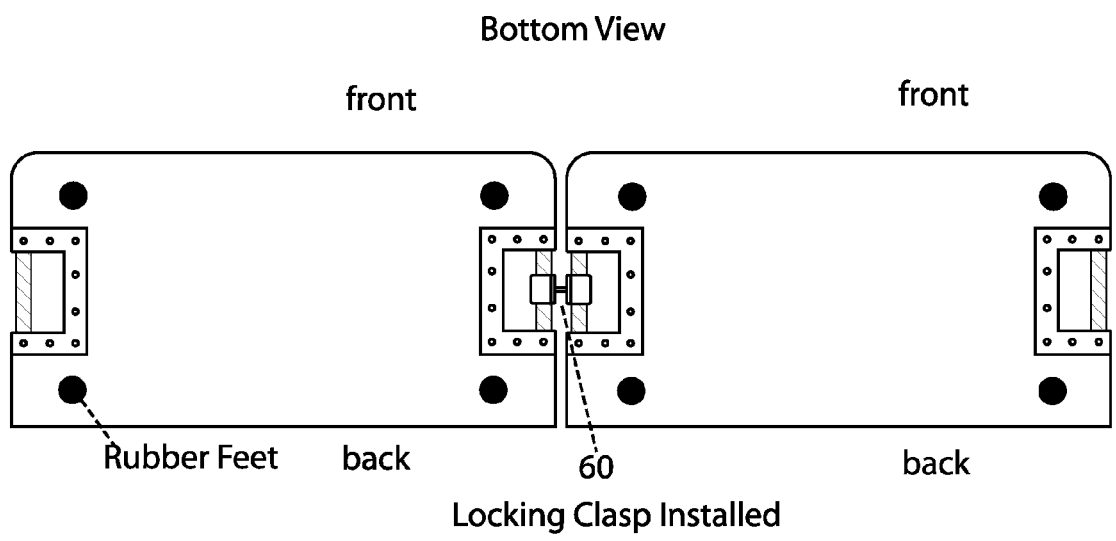
FIG. 6E

Profile View

Top Down View

Bottom View

SPEAKER SYSTEM AND AMPLIFIER

This application claims benefit of and priority to U.S. Provisional Application No. 61/226,184, filed Jul. 16, 2009, for a "Speaker System and Amplifier," and is entitled to that filing date for priority. The specification, figures and complete disclosure of U.S. Provisional Application No. 61/226,184 are incorporated herein by specific reference for all purposes.

FIELD OF INVENTION

This invention relates to a speaker system. More particularly, this invention relates to a speaker system used for the acoustical and electronic amplification of sound.

BACKGROUND OF THE INVENTION

Typically, speaker systems have been used to acoustically and electronically reinforce amplified sound reproduction of musical and other audio performances, whether by live instrumentation or by playback of recorded material. The speaker systems may include single or multiple speakers loaded within rectangular speaker cabinets. Conventional rectangular speaker cabinets, especially when loaded with multiple speakers (e.g., the common so-called "4x12" enclosure), may exhibit a narrow beam of sound originally intended to project the sound in a "long throw" manner during live performances.

With modern sound reinforcement practices, this may no longer be necessary in many cases, and may even be perceived as harsh and sonically undesirable. This "beam" of sound may effectively create an effect similar to a comb filter, whereby clear peaks and troughs of sound energy are experienced based on the location of a listener relative to the axis of the speaker. For example, as a listener moves across the plane of the speaker face, the volume, distortion, and/or other characteristics of the sound may significantly change.

This may create an undesirable experience for audience members located within the dispersion pattern. Further, some sound system engineers counteract the effect by omitting a significant portion of the audio spectrum associated with the "beaming" performance to achieve a more pleasing overall audio mix. While this practice may be common, it may be detrimental to the original performance. For example, many live audience members may experience the performance from a location that is off-axis from the speaker, or may listen to a recorded version that has been significantly "corrected" by a sound engineer in an attempt to recreate the original sound.

SUMMARY OF INVENTION

In various embodiments, the present invention comprises a speaker enclosure having a bottom panel, a left side panel, and a right side panel, configured to form a substantially triangular-shaped enclosure frame. A triangular-shaped front baffle panel is coupled with the enclosure frame. In certain embodiments, a triangular-shaped back baffle panel is also coupled with the enclosure frame. The front and/or back baffle panels may be coupled with the enclosure frame to form a substantially triangular-shaped open-back or closed-back speaker enclosure. In one embodiment, a high-density cellulose material may be coupled with the internal surface of one panel of the enclosure frame (e.g., covering the entire internal surface area of the panel). In another embodiment, a sound post may be coupled between the front baffle panel and the back baffle panel. In some embodiments, the enclosure may contain a port with an attachable and detachable lid.

Exemplary embodiments of the speaker enclosure may be loaded with one or more speakers. In some embodiments, the speakers are mounted equidistant and in a contiguous manner. This may reproduce amplified sound with high tonal quality, including a reduction of the "beaming" effect that may be associated with conventional rectangular speaker cabinets across their forward-facing dispersion pattern. In one embodiment, the speaker enclosure is loaded with three speakers, each mounted equidistant from the center of the speaker enclosure, with the sound post centered in the void between the speakers. In another embodiment, the enclosure may contain additional space to accommodate electronic circuitry, for example, an amplifier.

It will be appreciated that these and other embodiments will be described in more detail below and with respect to the appended figures. In the appended figures, similar components and/or features may have the same reference label. Further, various components of the same type may be distinguished by following the reference label by a second label that distinguishes among the similar components. If only the first reference label is used in the specification, the description is applicable to any one of the similar components having the same first reference label irrespective of the second reference label. In some cases, the first reference label is used in the specification to refer generally to functionality of embodiments of the referenced component. For example, where a component is discussed with reference to a figure on which the component is not shown, the first reference label is used in the specification to indicate general functionality of embodiments of the referenced component.

DESCRIPTION OF THE DRAWINGS

FIGS. 1A-1C show views of a triangular-shaped speaker enclosure in accordance with an exemplary embodiment of the present invention.

FIGS. 6C-6D show views of a locking ring or clasp.

FIG. 6E shows two speaker enclosures connected with a locking ring or clasp attached to respective handle assemblies.

DETAILED DESCRIPTION OF EXEMPLARY EMBODIMENTS

In several exemplary embodiments, the present invention comprises a speaker enclosure. A speaker enclosure can be considered as comprising an enclosure frame, one or more baffle panels, and other components as described herein. Various features of embodiments of the invention will be appreciated by the following descriptions. The features are described with reference to various embodiments, and should not be construed as limiting the scope of the invention in any way. For example, certain features may only be included in, or provided by, certain embodiments.

Figure 1B:
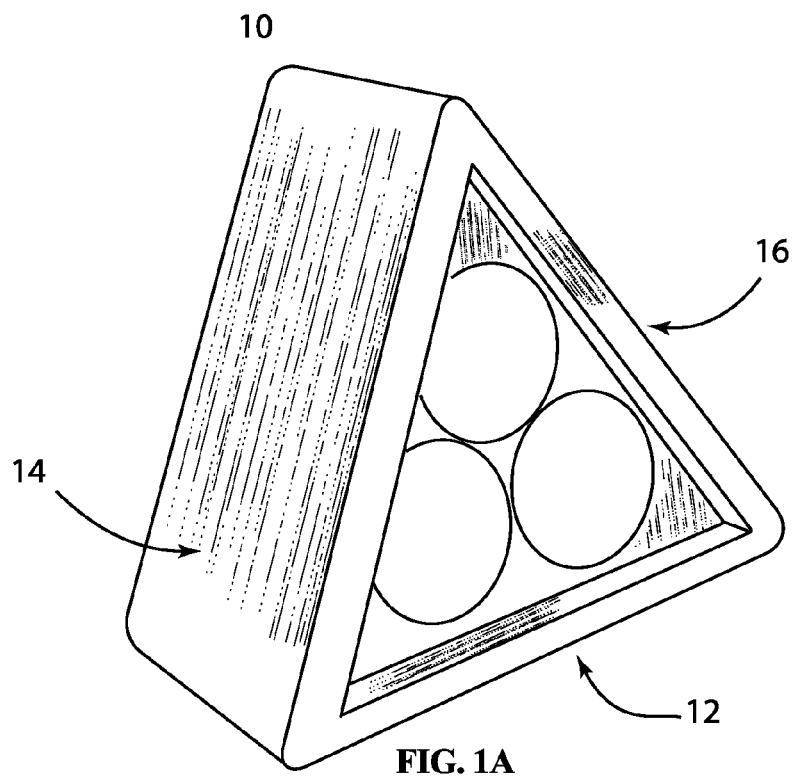
Figure 1B:
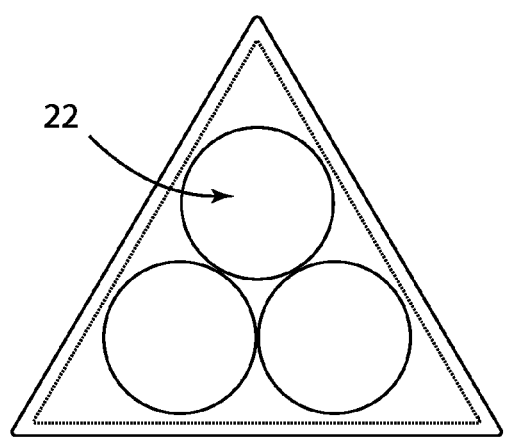
Figure 1C:
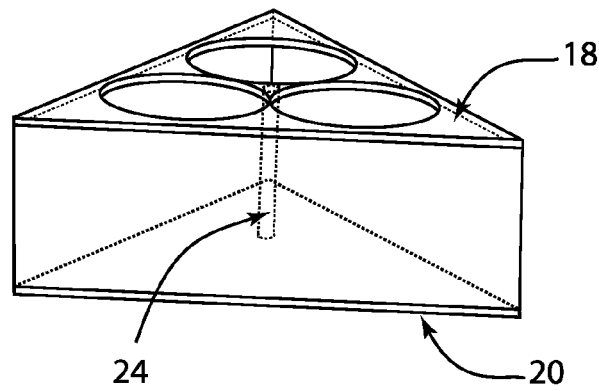
Figure 2A:
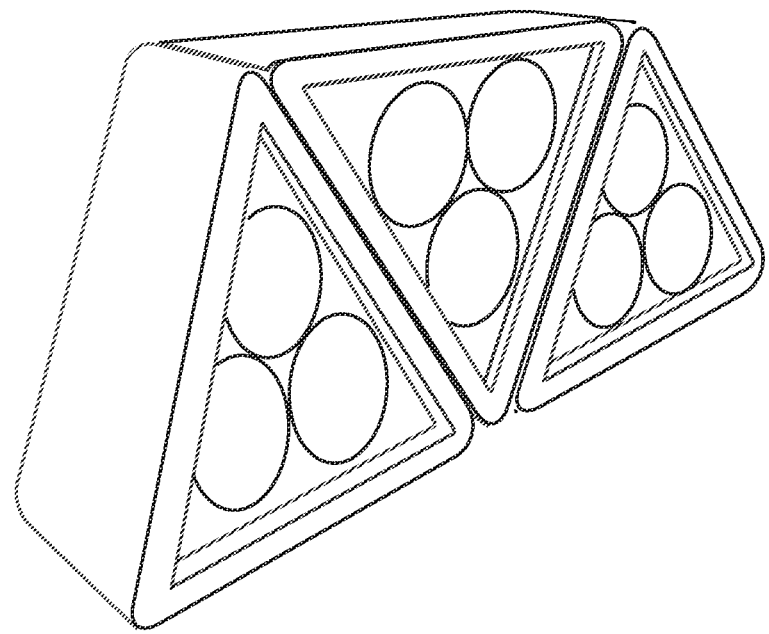
FIGS. 2A-2E show views of multiple triangular-shaped speaker enclosures stacked in a row or pyramid.
Figure 2B:
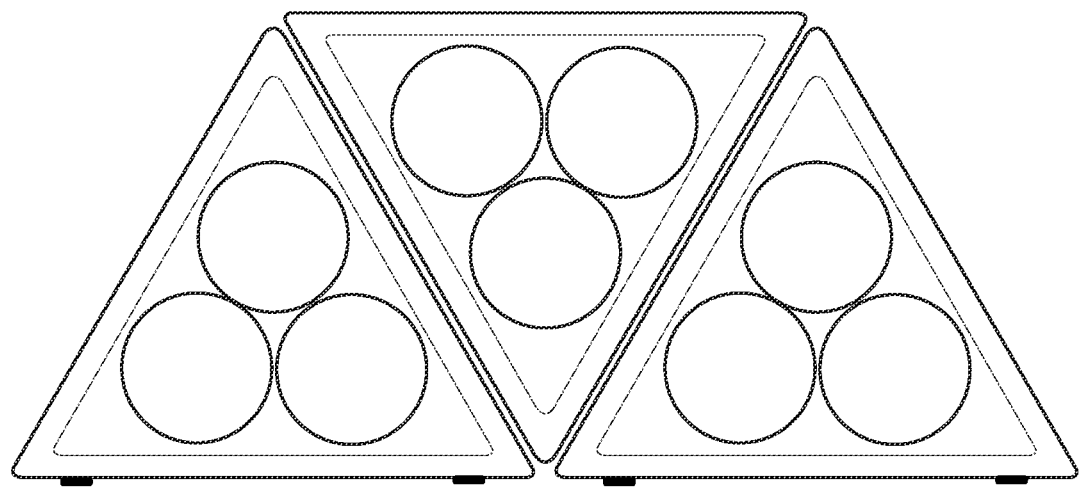
Figure 2C:
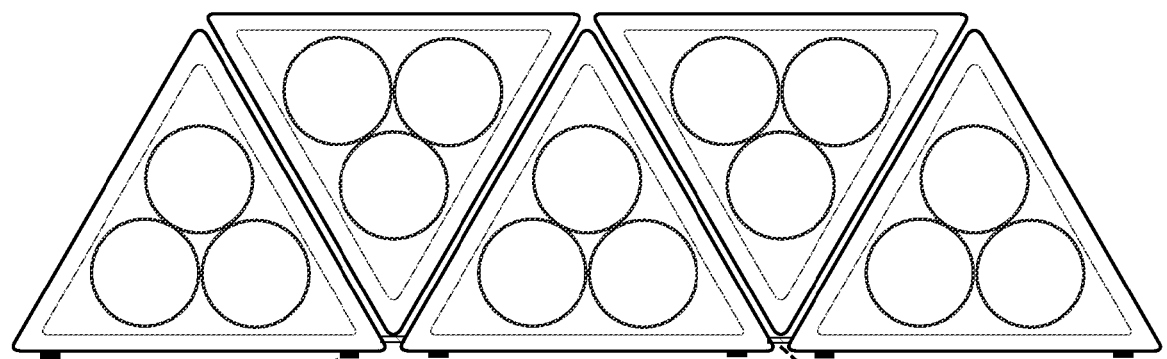
Figure 2D:
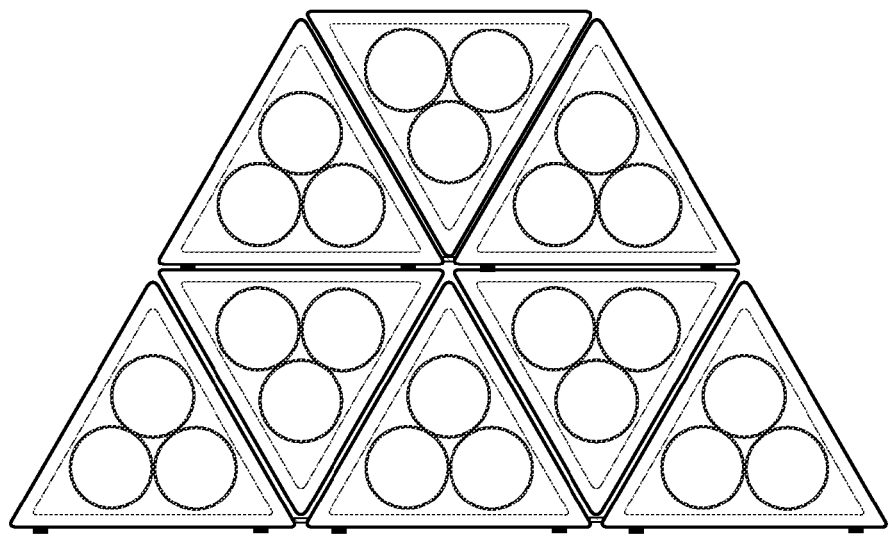
Figure 2E:
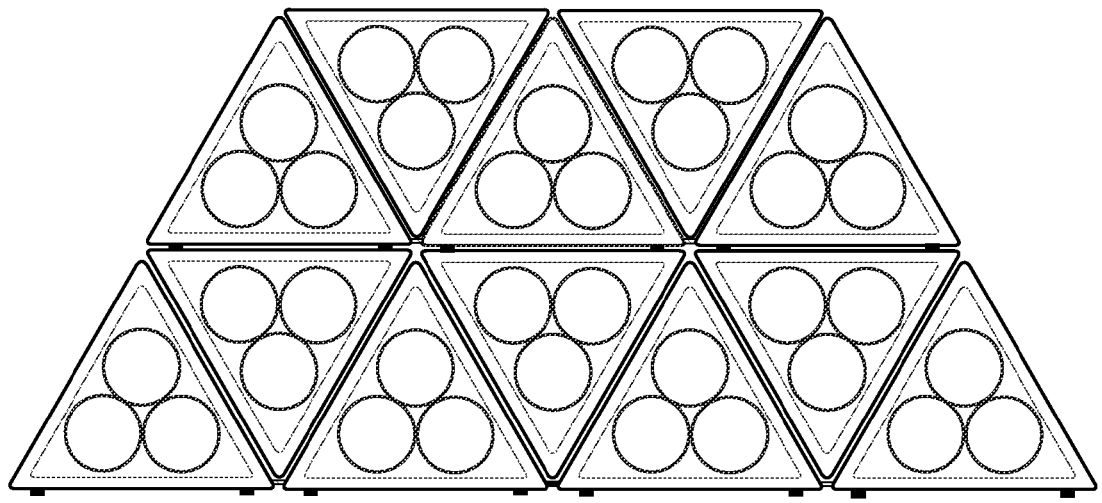

FIGS. 1A-1C show three views of one embodiment comprising a triangular-shaped speaker enclosure 10. The enclosure comprises an enclosure frame comprising a bottom panel 12, a left panel 14, and a right panel 16 configured in a substantially triangular shape. The panels may be contiguous, or separate and joined at their ends. The enclosure may further comprise a front baffle panel 18 or a back baffle panel 20, or both. The front and back baffle panels may be triangular in shape as shown, although other shapes may be used. The front baffle panel may have one or more openings 22 in which to mount one or more loudspeakers. The front and/or back baffle panels may be coupled with the enclosure frame to form a substantially triangular-shaped open back (i.e., no back baffle panel) or closed-back (i.e., with back baffle panel) enclosure.

Extensive experimentation has shown the triangular shape, and particularly the substantially equilateral triangular shape, to manifest desirable acoustical properties. For example, embodiments having triangular baffle boards coupled with a triangular enclosure frame have been shown to reproduce amplified sound with high tonal quality, including a reduction in the "beaming" effect that may be associated with conventional rectangular speaker cabinets across a forward-facing dispersion pattern.

In one embodiment, the triangular enclosure comprises radius members at the vertices of the triangle. The radius members may form substantially 60-degree angles in certain embodiments. Further, the radius members may provide additional features, including structure or material for reinforcing the edges and/or corners of the enclosure (e.g., corner brace 30), structure or material for reducing movement or vibration (e.g., rubberized feet or corners 34), or receivers for a handle member 32, as shown in FIGS. 5A-5C, 6A and 6B.

Various manufacturing processes may be used according to various embodiments. For example, components of the enclosure may be manufactured with any useful material that may or may not be acoustically active, including, but not limited to, wood, particle board, plywood, composite, plastic, metal, or similar material. The enclosure may be formed using panels or one or more contiguous pieces. In one embodiment, the enclosure frame (i.e., bottom, left and right panels) and front baffle panel are formed in a single piece by milling and shaping a solid block of wood. In another embodiment, the enclosure frame is formed by extruding metal or plastic into the triangle shape.

In several exemplary embodiments, one or more posts 24 are coupled between the front and back baffle panels 18, 20. In one embodiment, a single center post 24 is coupled at the planar center of each baffle panels as shown in FIG. 1C. The post(s) may be configured to mitigate or eliminate any phase differences between the baffle panel vibrations. For example, it may be undesirable to allow the front baffle panel 18 and the back baffle panel 20 to ever vibrate out of phase with respect to each other.

Other exemplary embodiments comprise substantially triangular ports 40 on the front or back baffle panels, as shown in FIG. 7A-7F. Extensive experimentation has shown the triangular port shape, and particularly the substantially equilateral triangular port shape, to manifest desirable sound reproduction properties. For example, embodiments having triangular speaker chambers as defined by a triangular enclosure frame, or triangular enclosure subframe (e.g., triangular speaker chamber(s) contained inside of a rectangular exterior enclosure shell) have been shown to reproduce amplified sound with enhanced frequency response, including an extension of low frequencies, producing a perceptibly fuller sound throughout a 360 degree dispersion pattern.

Figure 8A:
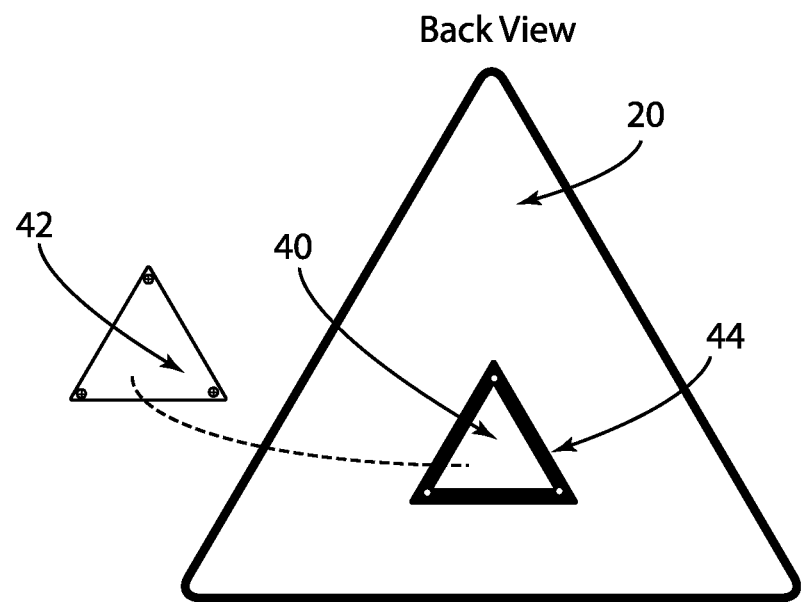
FIGS. 8A-8B show views of a triangular port with lid device.
Figure 8B:
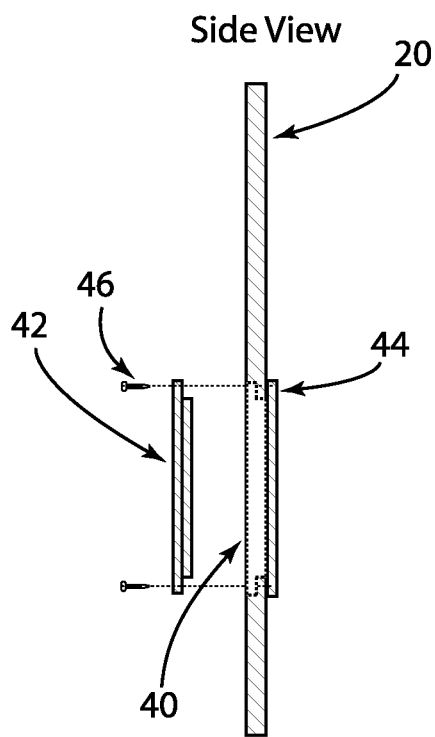
Figure 9A:
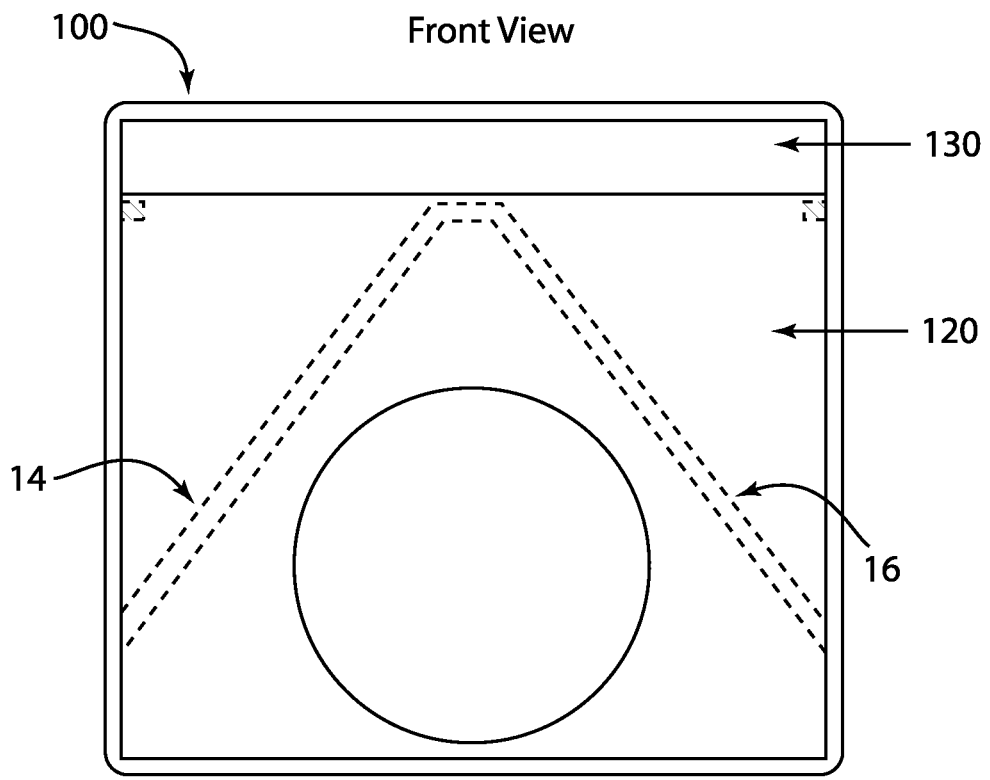
FIGS. 9A-9D show views of a speaker enclosure with interior isolated space(s) for an amplifier, tubes, transformers, or other apparatus.
Figure 9B:
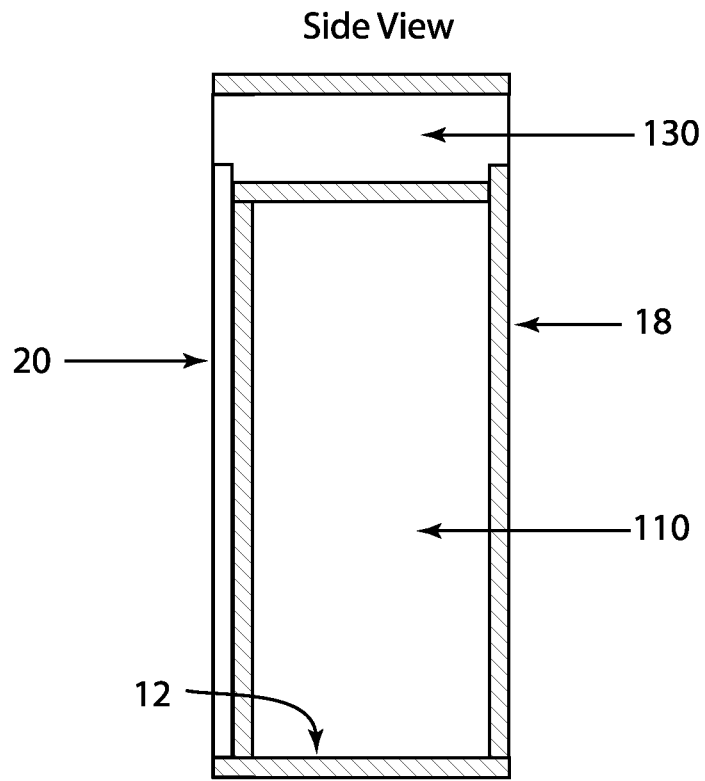
Figure 9C:
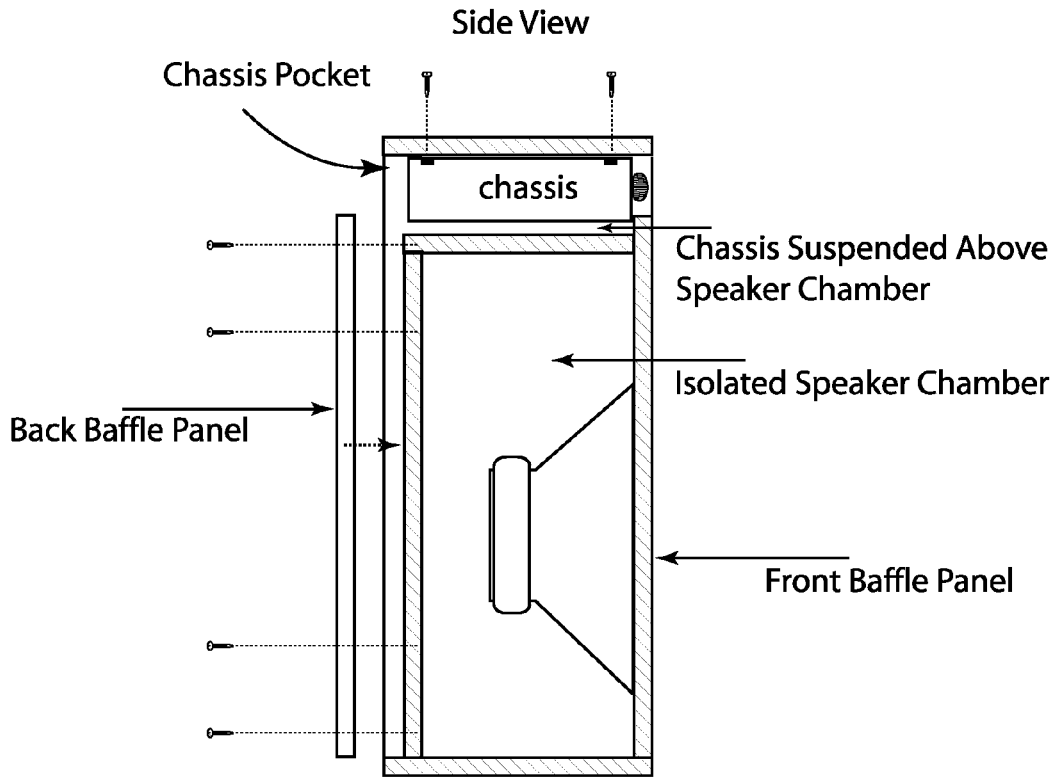
Figure 9D:
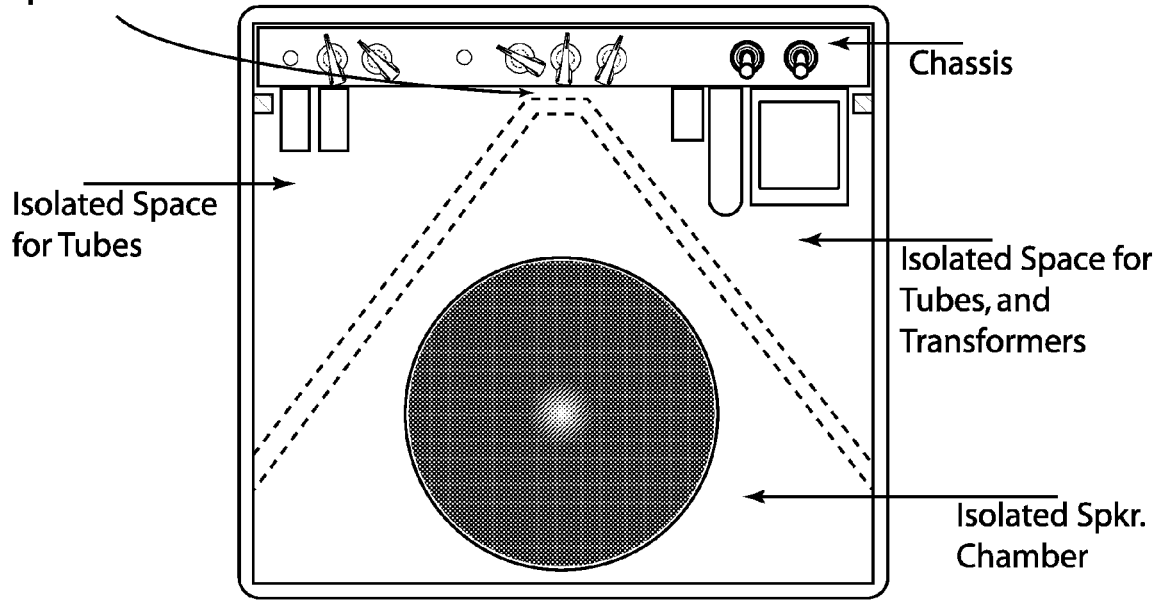

In one embodiment, the triangular port 40 is manufactured with an internal support structure 44 allowing the port to receive a triangular lid 42 as a method of attaching the lid and closing, or sealing, the port vent as shown in FIGS. 8A and 8B. Various attachment methods may be used. In one embodiment, the port lid may be attached to the back baffle panel by screws 46. In another embodiment, the port lid may be attached by materials that present substantial friction, grip, or locking properties, such as, but not limited to, Velcro, or molded components that snap securely into a locked position, or machined levers and gears that can be manipulated from a locked state and released for detachment.

Figure 3A:
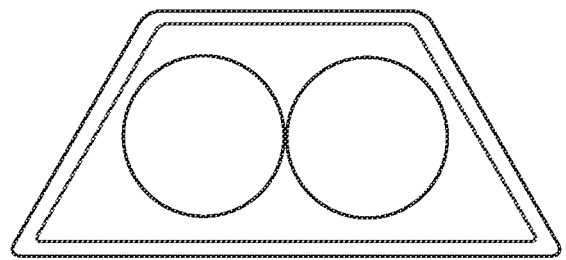
FIG. 3A shows a trapezoidal-shaped speaker enclosure in accordance with an exemplary embodiment of the present invention.
Figure 3B:
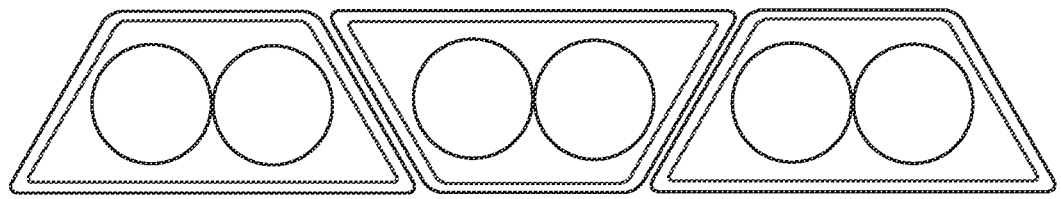
FIGS. 3B-3C show views of multiple triangular-shaped and trapezoidal-shaped speaker enclosures stacked in a row.

Various embodiments of the enclosure may use shapes other than an equilateral triangle. For example, the enclosure may take the form of a right triangle, an isosceles triangle, a trapezoid, a parallelogram, or other similar form. FIG. 3A shows an exemplary embodiment of an enclosure that is substantially trapezoidal in shape. This shape may allow stacking of one or more additional components on a top panel of the enclosure. For example, an amplifier, another speaker, or other apparatus may be stacked on the flat top panel. It is worth noting that, while other shapes may be used without departing from the scope of the invention, certain features may be realized using a substantially symmetric triangular shape.

Figure 3C:
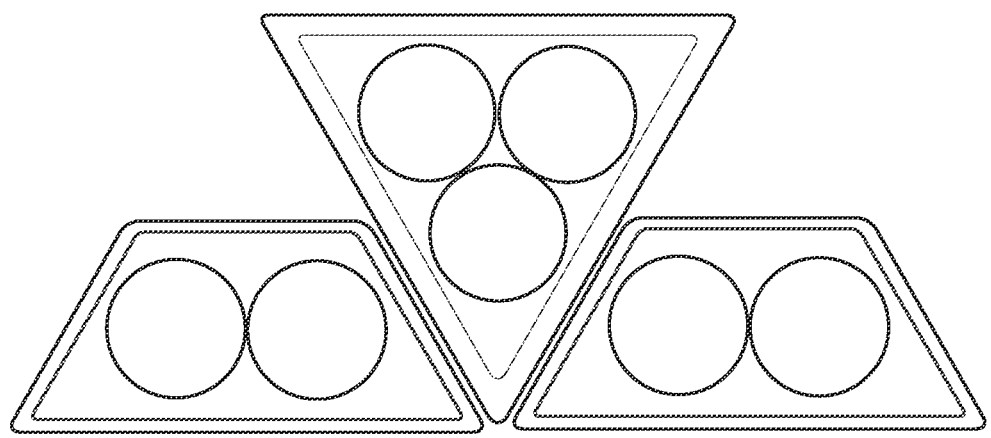
Figure 4A:
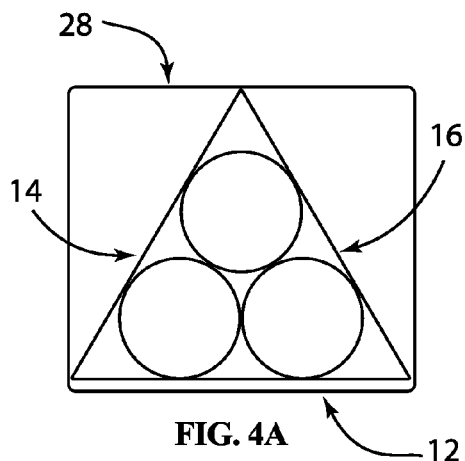
FIGS. 4A-4F show views of triangular-shaped enclosure subframes contained in a rectangular exterior enclosure shell.
Figure 4B:
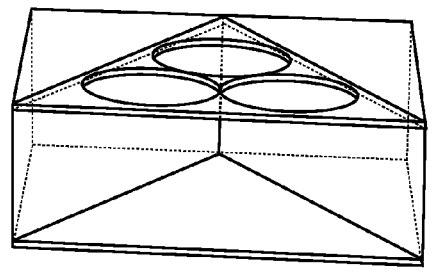
Figure 4C:
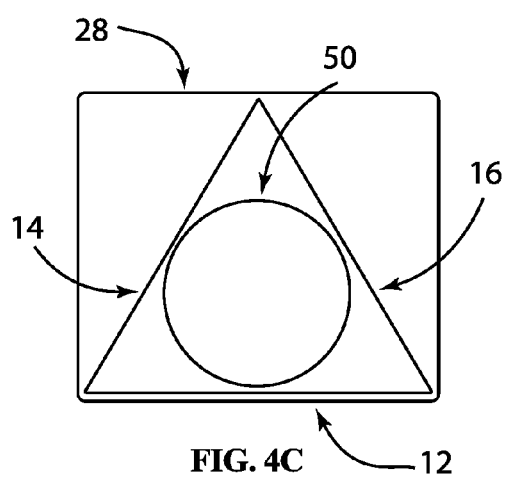
Figure 4D:
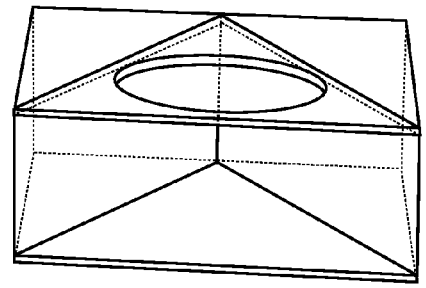
Figure 4E:
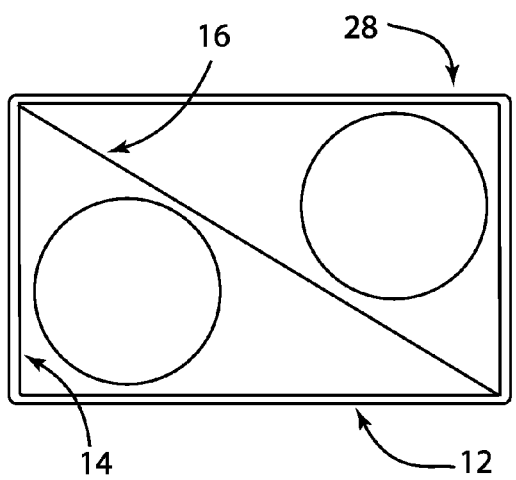
Figure 4F:
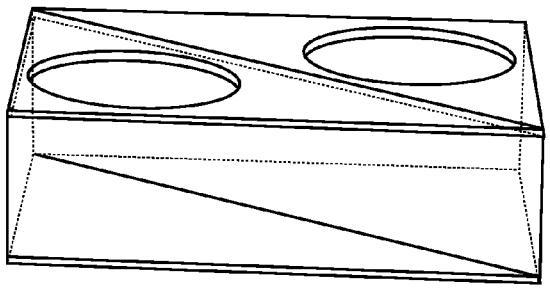
Figure 5A:
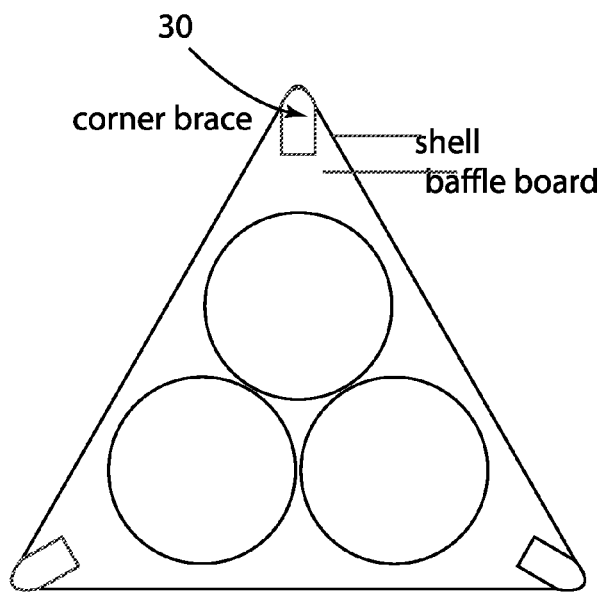
FIGS. 5A-5C show views of a triangular-shaped speaker enclosure with corner braces and handles.
Figure 5B:
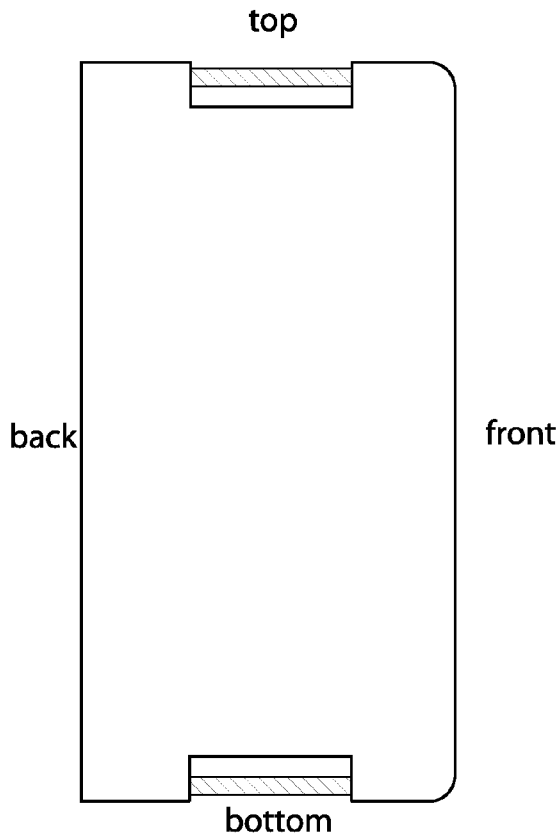
Figure 5C:
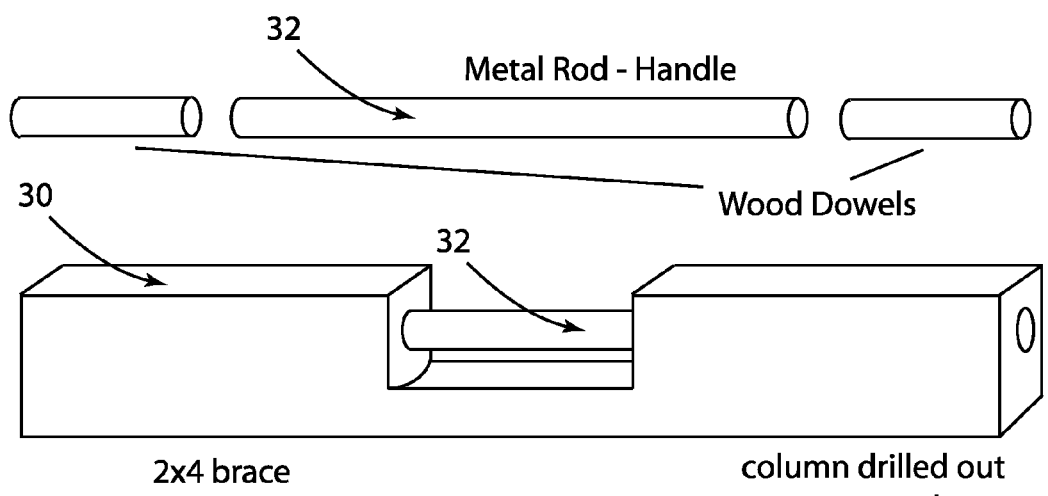

For example, the enclosure may be shaped to facilitate stacking of multiple enclosures, as shown in FIGS. 2A-2E, 3B and 3C. Enclosures with different shapes may be stacked together (e.g., triangular enclosure inverted between two trapezoidal enclosures, as shown in FIG. 3C). It will be appreciated that multiple speaker enclosures may be stacked and/or secured together in any compatible geometric shape, including, for example, a "pyramid" sized to satisfy a large-scale speaker system requirement for sufficiently reproducing multiple sound signals within a particular location (e.g., a musical performance stage).

Figure 6A:
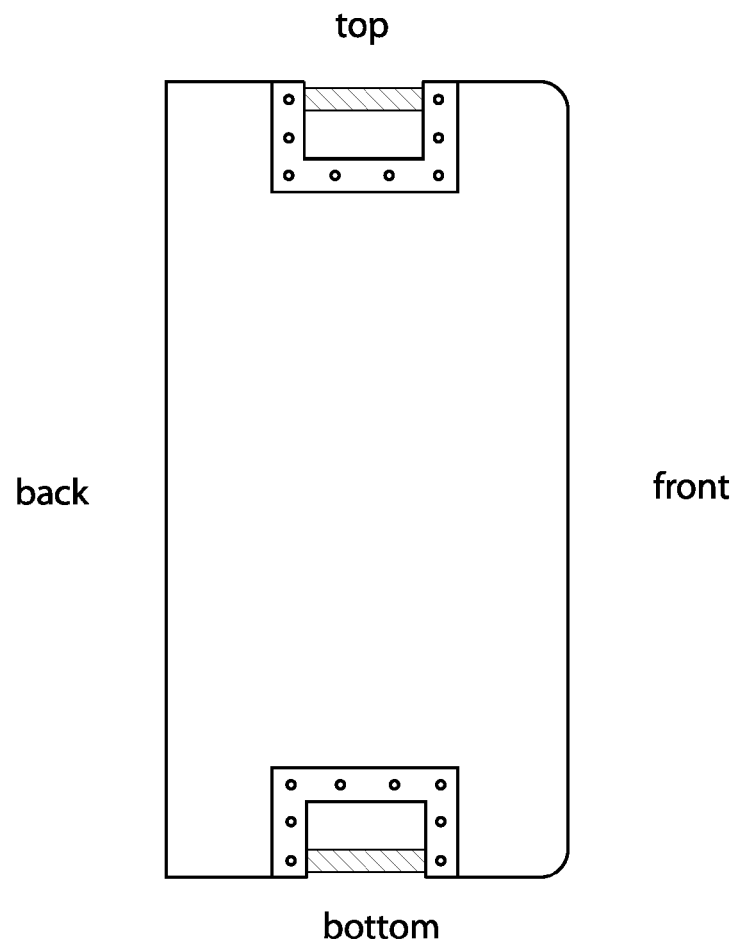
FIG. 6A shows a side view of a speaker enclosure with handle assemblies.
Figure 6B:
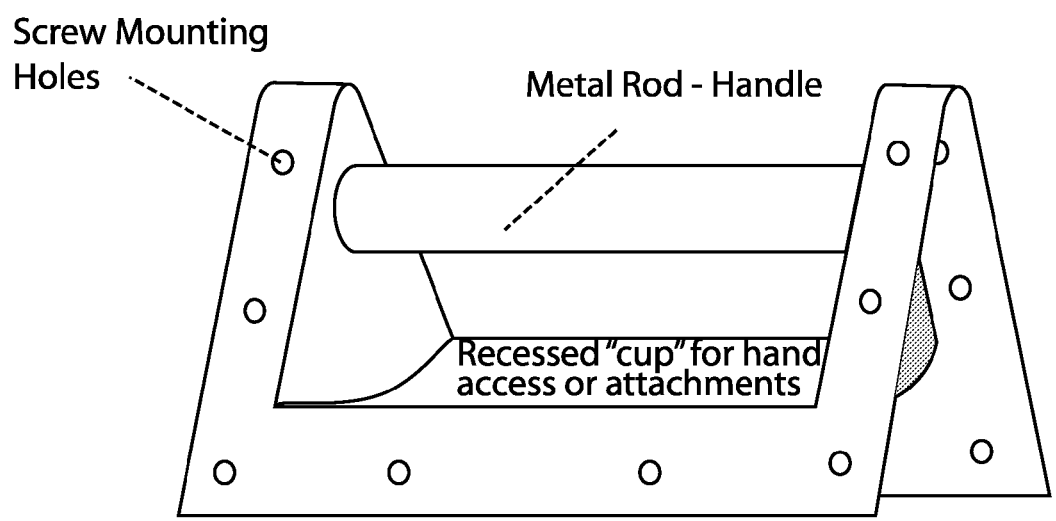
FIG. 6B shows a handle assembly from FIG. 6A.
Figure 6F:
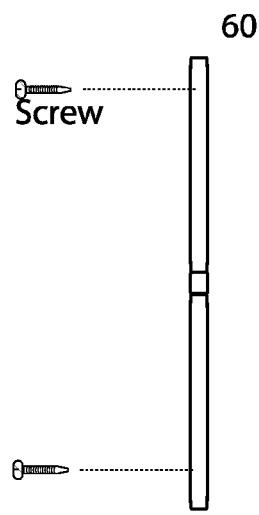
FIGS. 6F-6G show views of a locking bracket or hinge.
Figure 6G:
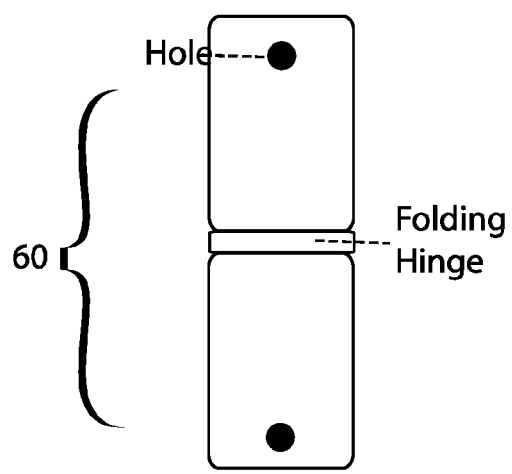
Figure 6H:
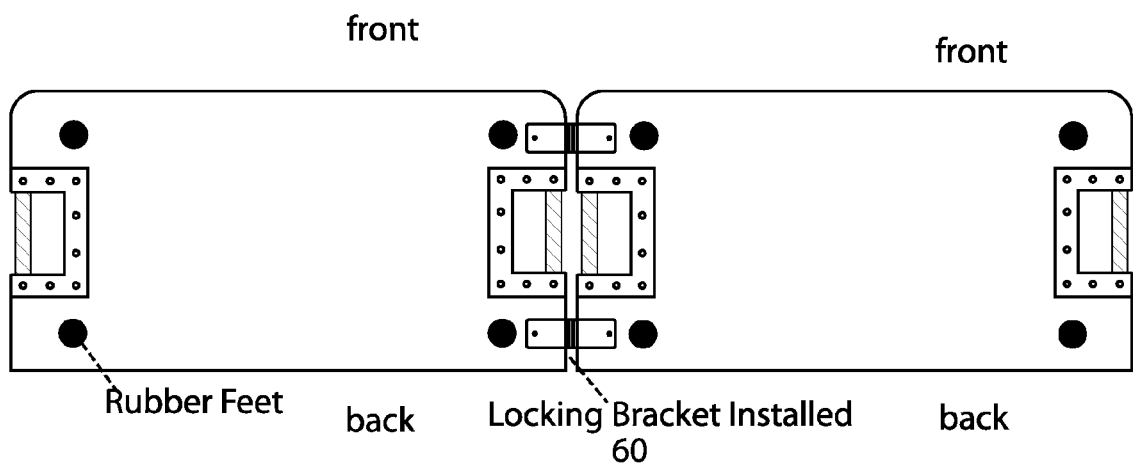
FIG. 6H shows two speaker enclosures connected with a pair of locking brackets or hinges.
Figure 7A:
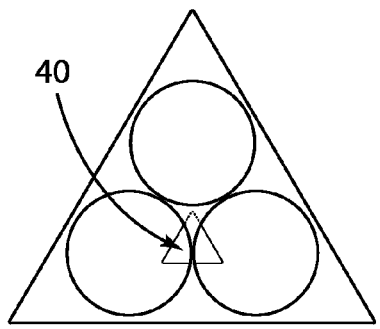
FIGS. 7A-7F show views of triangular-shaped enclosure subframes contained in a rectangular exterior enclosure shell with a triangular port or ports in the front or back baffle panels.
Figure 7B:
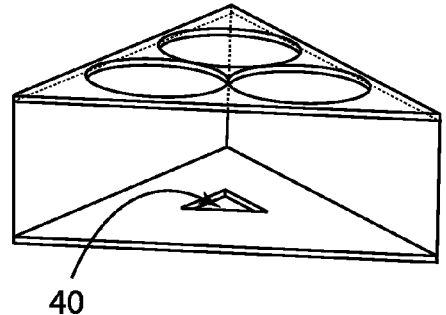
Figure 7C:
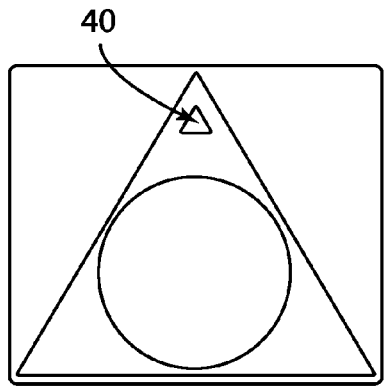
Figure 7D:
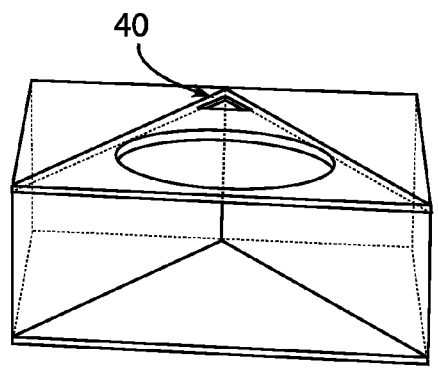
Figure 7E:
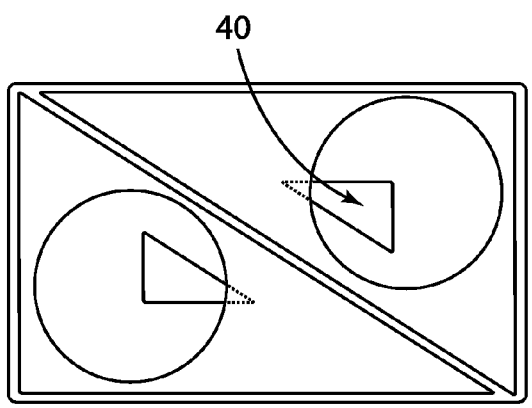
Figure 7F:
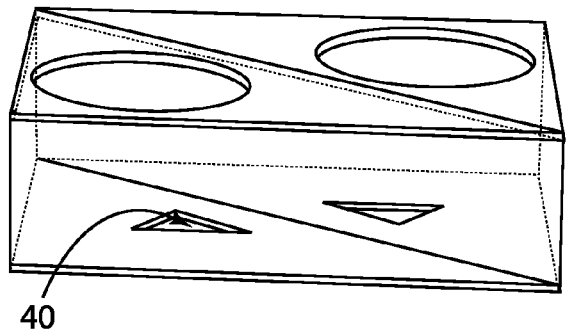

Several exemplary embodiments also may comprise one or more locking members or attachments 60, configured to facilitate stacking and/or other speaker configuring. For example, the locking member(s) 60 may couple with one or more of the handle members 32 to lock multiple speaker enclosures together, as seen in FIGS. 6C-6E. Alternatively, a locking bracket 62 with a hinge may fastened by screws (or otherwise) to adjacent speaker enclosures, as seen in FIGS. 6F-6H. This may increase rigidity of speaker clusters, reducing undesired sound distortion due to cabinet vibrations at higher sound pressure levels.

Further, the shape may be designed to provide strength to the enclosure (e.g., selection of a symmetric triangular shape may provide a certain amount of strength), and/or its acoustic properties (e.g., the shape, size, material, and/or other physical properties may affect the resonance of the enclosure). Even further, the size of the enclosure may be determined according to certain conventional dimensions of speaker systems. For example, the size may be selected to fit in a conventional location on a stage, to be carried in a conventional-sized hard case, to be light enough for single-person lifting, and the like.

FIGS. 4A-4F show several embodiments of a speaker enclosure where a triangular enclosure frame (or subframe), comprised of the bottom panel 12, left panel 14, and right panel 16, is contained inside of a rectangular exterior enclosure shell 28. The front baffle panel 18 may be rectangular and extend across the front of the rectangular exterior enclosure shell. Alternatively, the front baffle panel may extend only across the front of the triangular enclosure subframe, with additional front panels to fill in the additional space across the front. The back baffle panel, if present, may be constructed in a similar fashion. As shown in FIGS. 4A-4F, a single exterior enclosure shell may contain multiple enclosure subframes, and each enclosure subframe may encompass one or more speakers.

In several embodiments, the enclosure comprises additional internal space for the purpose of accommodating electronic circuitry (e.g., an amplifier chassis containing electronic circuitry). Thus, for example, as seen in FIGS. 9A-9D, a speaker enclosure 100 may include a triangular enclosure subframe creating a triangular speaker chamber 110 in addition to isolated space 120 set aside to accommodate an amplifier chassis, tubes, transformers, electronic components, circuitry, or other apparatus. Even further, the electronic components, circuitry, vacuum tubes and the entire electronic chassis assembly may be isolated in a chassis pocket 130 away from the direct air movements generated by the speaker driver to minimize microphonics and vibrations.

Figure 10:
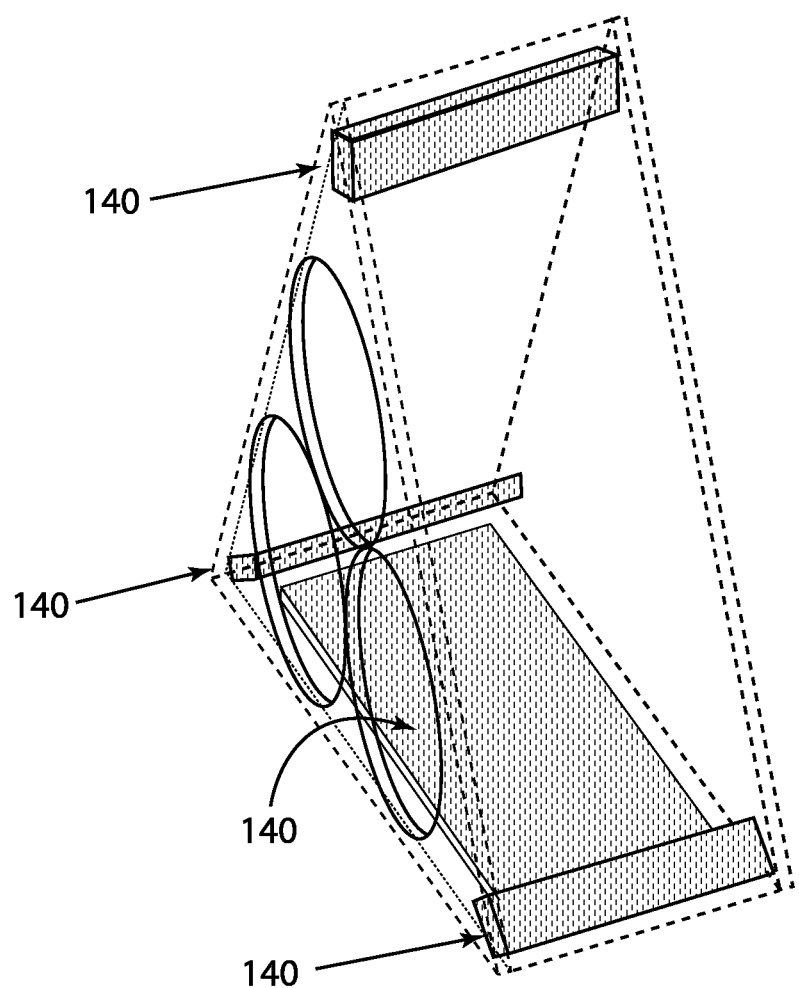
FIG. 10 shows a triangular-shaped speaker enclosure with interior foam.

In several embodiments, some or all of the internal surface area of the enclosure frame is layered or covered with a material having a particular acoustical property. In one embodiment, the internal surface area of one or more panels of the enclosure frame is covered with a high-density cellulose material 140 (e.g., a foam). This may effectively break up standing waves that may form during operation of the speakers mounted within the enclosure. In one embodiment, the internal base panel and internal corner members are treated with foam 140, as shown in FIG. 10. The amount, type, and/or location of the material may affect the acoustical properties, and may be selected according to certain design considerations. For example, it may be desirable to balance the mitigation of standing wave issues, the over-damping (e.g., muddiness) of the sound caused by an excess of material, the cost of providing the material (e.g., including the cost of manufacturing certain types or shapes of foam, the cost of precision location of the material, and the like), and other factors.

Figure 11A:
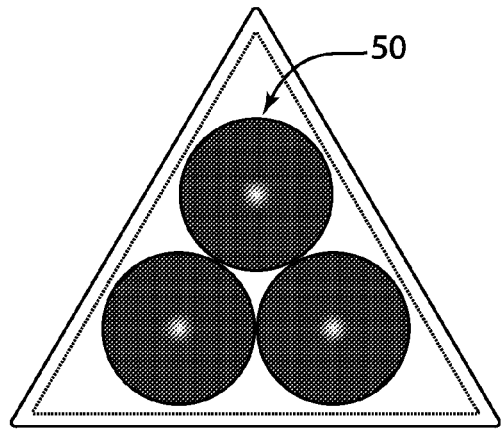
FIGS. 11A-11D show various configurations of speakers mounted on the front baffle panel of a triangular-shaped speaker enclosure.
Figure 11B:
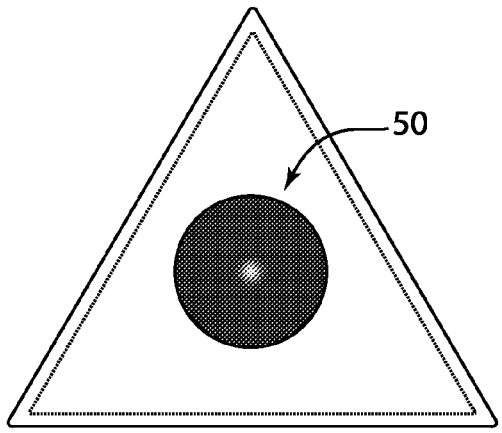
Figure 11C:
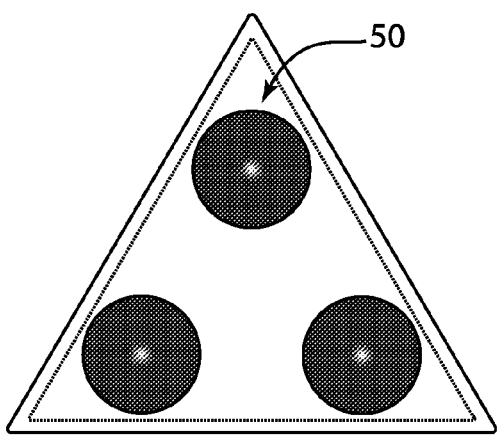
Figure 11D:
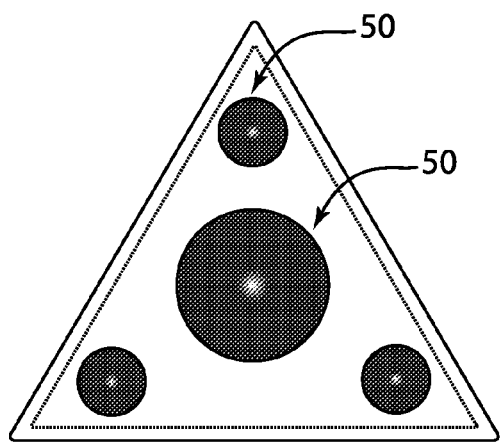

Embodiments of the speaker enclosure are loaded with one or more speakers 50, which are mounted in the speaker openings 22. In certain embodiments, multiple speakers are mounted substantially equidistant (e.g., radially) from a center point of the enclosure (see FIGS. 1B, 11A). This may produce an effect similar to that of a single point source. Other configurations are possible. In one embodiment, a single speaker is mounted in the center of the enclosure (see FIG. 11B). In another embodiment, three speakers are mounted at each corner of the triangular-shaped enclosure (see FIG. 11C). In still another embodiment, a single speaker is mounted in the center of the enclosure, and three speakers, which may be of a different size than the center speaker, are mounted in a triangle shape at each corner of the enclosure (see FIG. 11D), wherein each set of three speakers is spaced equidistant from the center of the speaker mounted in the center of the enclosure.

Figure 12A:
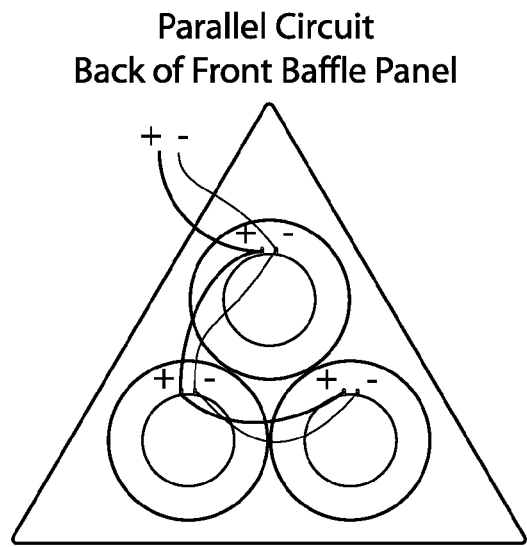
FIGS. 12A-12C show various wiring configurations for speakers mounted on the front baffle panel of a triangular-shaped speaker enclosure.

In embodiments where multiple speakers are used, the speakers may be coupled in a variety of ways. In one embodiment, the speakers are electronically coupled as a parallel network (see FIG. 12A). For example, the impedances of three speakers in the enclosure may be modeled substantially as a three resistors coupled in parallel between a common power source. The parallel circuit configuration driven by a power amplifier may reduce, or even eliminate, combined voltage and current changes that may be associated with typical series-parallel electronic circuits. This may effectively produce a perceivable immediacy to the amplified sound.

Figure 12B:
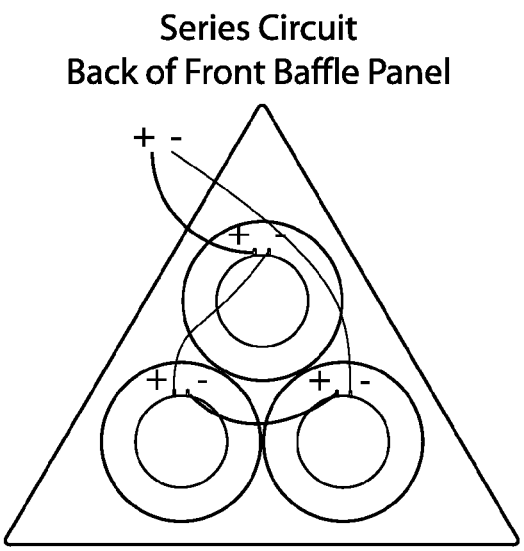
Figure 12C:
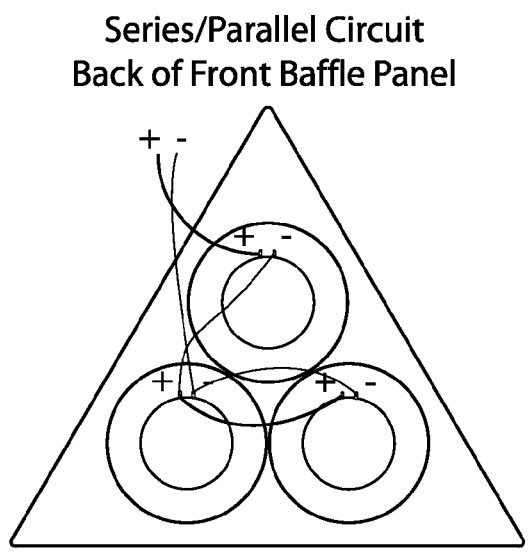

It will be appreciated that other circuit configurations are possible. For example, series or series-parallel networks are possible (see FIGS. 12B-12C). In certain embodiments, one or more additional components may be included as part of the speaker circuitry. For example, the circuitry may include power components (e.g., adaptors, supplies, transformers, rectifiers, conditioners, and the like), audio components (e.g., filters), and other devices.

Figure 13:
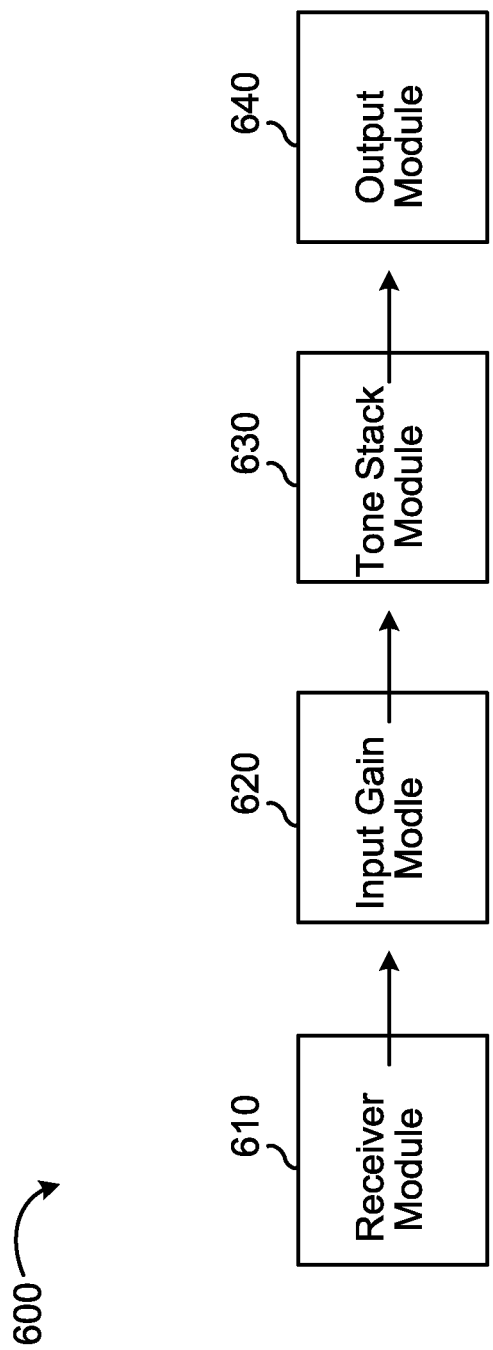
FIG. 13 shows components of an amplifier system in accordance with an exemplary embodiment of the present invention.

Embodiments of speaker systems (e.g., including the speaker systems disclosed above with respect to FIGS. 1-12) may typically be driven by an amplifier. As shown in FIG. 13, embodiments of an amplifier 600 may include a receiver module 610, an input gain module 620, a tone stack module 630, and an output module 640. In various embodiments, one or more of these modules may include various analog or digital components, including, for example, vacuum tubes, transistors, and similar components.

An audio signal may be received at the amplifier 600 by the receiver module 610. For example, the audio signal may be communicated from a guitar, through a standard instrument cable, and into a port in the receiver module 610 that is configured to receive the signal from the instrument cable. The audio signal may typically be amplified by the input gain module 620 (e.g., acting as a first gain stage that may be controlled at least in part by a volume control, like a volume knob on the amplifier), then processed (e.g., "finished," filtered, or the like) according to a desired tone profile by the tone stack module 630. The amplified and processed signal may then be passed to the output module 640, which may prepare the signal to be communicated to a speaker. For example, the output module 640 may include one or more additional gain stages, drivers, filters, ports, controls, and similar components.

In many high-gain tube guitar amplifiers, multiple gain stages are used sequentially to provide a desired effect. For example, at each gain stage, the amplifier applies gain to the signal, then brings the signal back under control, before moving on to the next stage. While this may increase the signal gain over multiple stages and allow for tailoring of the tone, it may also significantly impact the objective dynamic structure and subjective "feel" of the amplifier.

Figure 14A:
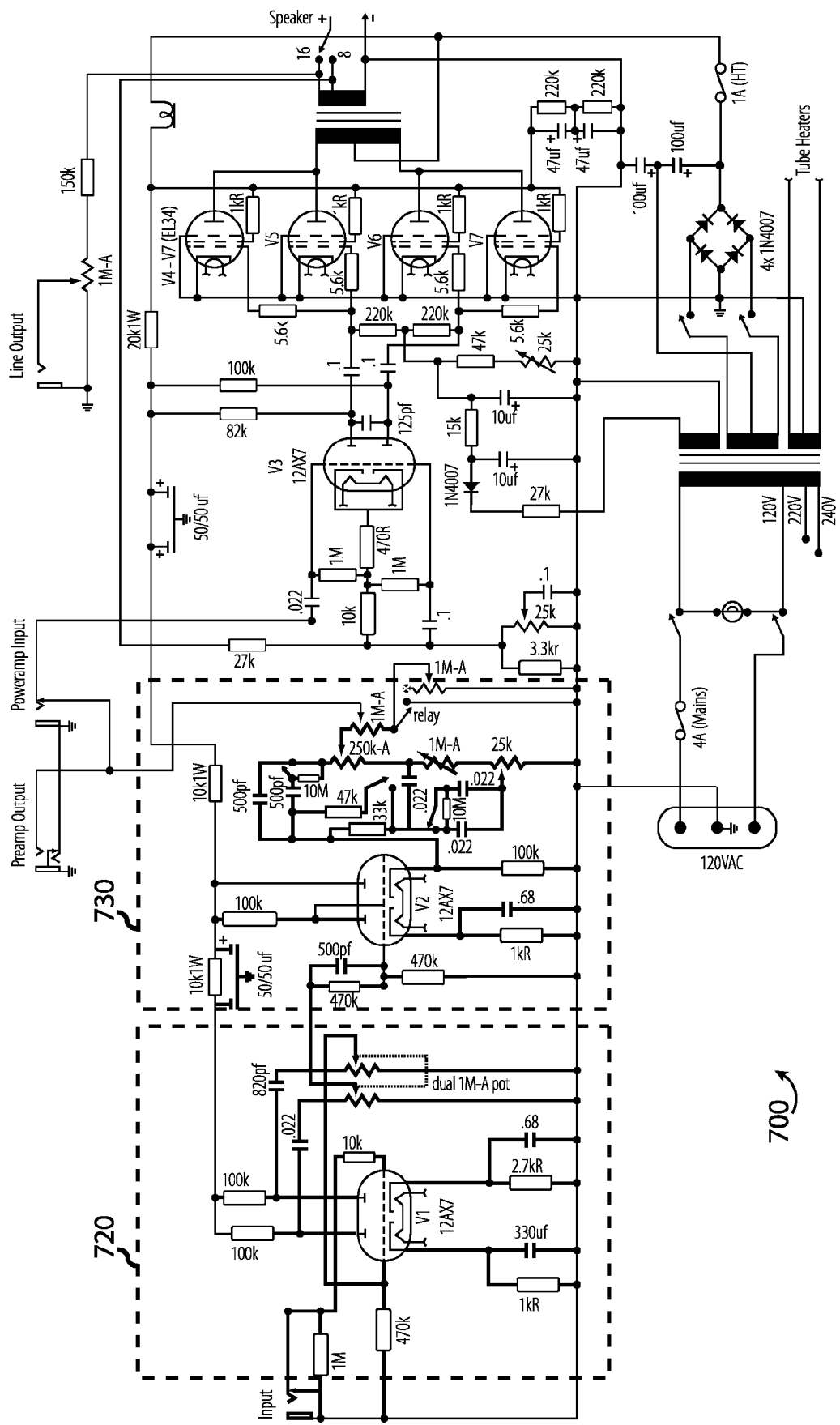
FIG. 14A is a schematic diagram of an amplifier circuit with a gain module and tone stack module, in accordance with an exemplary embodiment of the present invention.
Figure 14B:
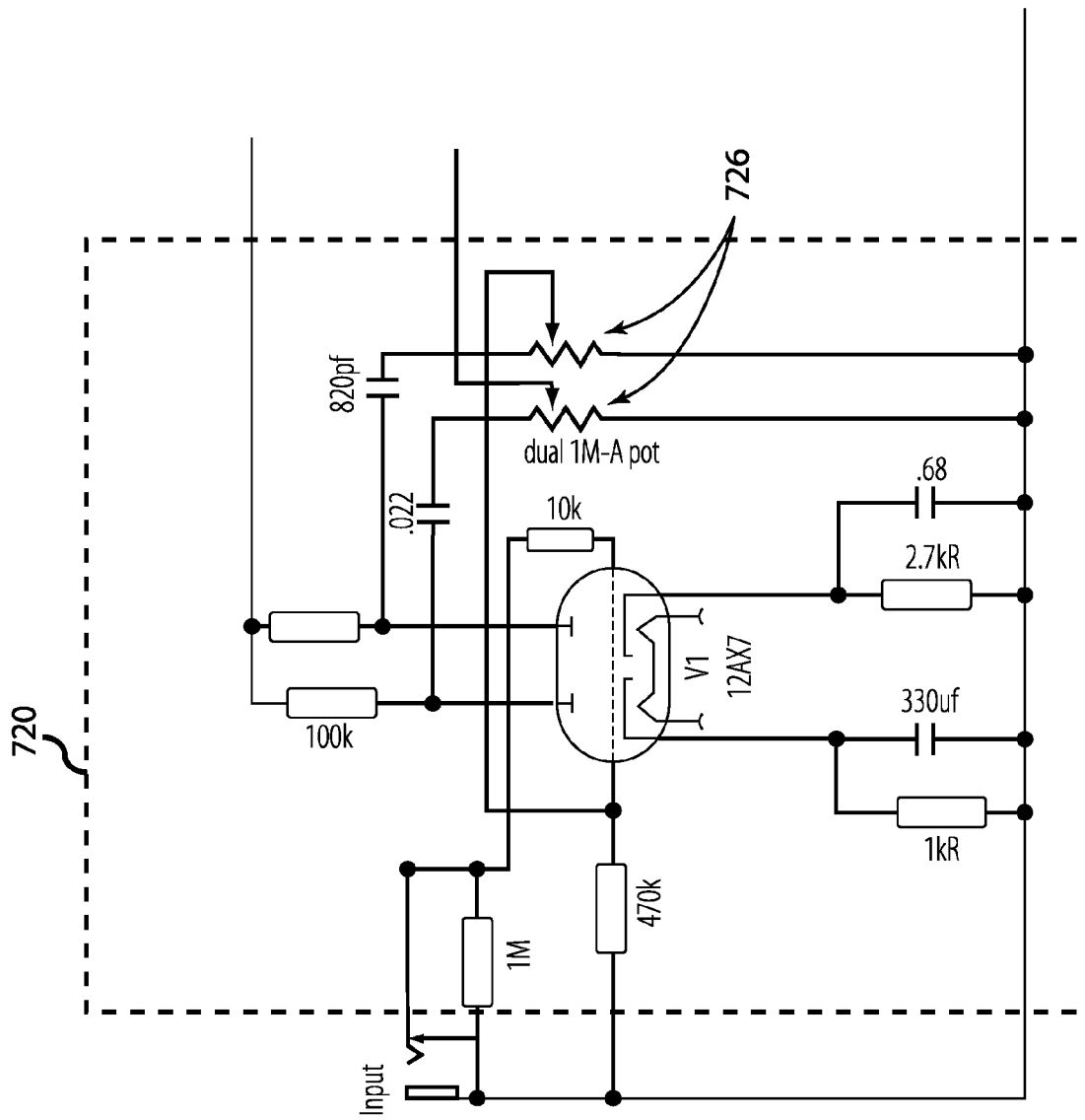
FIG. 14B is a schematic diagram of the gain module of FIG. 14A.
Figure 14C:
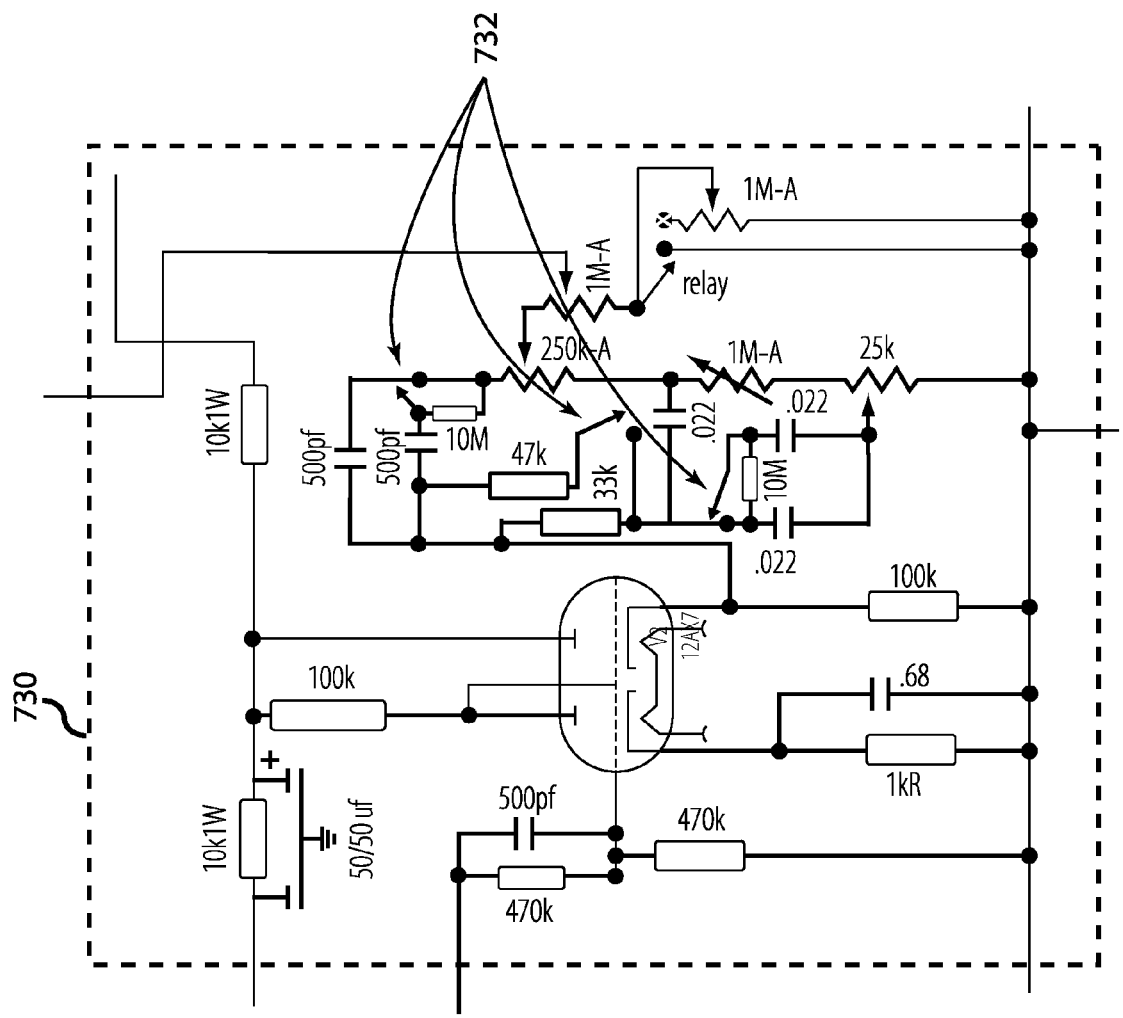
FIG. 14C is a schematic diagram of the tone stack module of FIG. 14A.

FIGS. 14A-14C show a schematic diagram of an amplifier circuit 700, according to various embodiments of the invention. The amplifier circuit includes a novel input gain module 720 and a novel tone stack module 730. As shown, V1 is a dual-triode tube (two separate amplification devices inside of a vacuum sealed glass case). The input signal is fed into a first part of V1. In one embodiment, this provides a factor of 100 with regard to signal gain. The output of the first part of V1 is fed into a second part of V1. In one embodiment, this re-applies the gain factor. For example, a gain factor of 100 may be effectively applied twice, which may provide a factor of close to 10,000 with respect to signal gain.

It will be appreciated that one effect of the input gain module 720 may be a buildup of distortion. This may cause the amplifier 700 to clip the signal with square wave characteristics, the clipping sound to be prominent (e.g., always present along with the original signal), and stronger note transitions (e.g., a guitarist strumming or picking the notes harder) to be reproduced with a distortion effect. As such, some embodiments include a dual gain control module. As shown in FIGS. 14A and 14B, a dual 1M potentiometer 726 is included to simultaneously control signal levels in two locations, the feed-forward path of the input gain module 720 (e.g., as the signal is being fed from the first part of V1 to the second part of V1) and the input of the tone stack module 730 (e.g., as the signal is being fed from the second part of V1 to the first part of V2).

This may effectively manage the signal levels and allow the amplifier 700 to exploit low level and high level input signals more effectively. This may allow a guitarist to reproduce clean sounds (e.g., sounds that are free of clipped signals) as well as overdriven signals (e.g., sounds that are heavily saturated with clipped signals) by adjusting a single control knob attached to the dual 1M potentiometer. Setting this control in a range from 1%-25% of maximum may produce various clean sounds (e.g., sounds that are free of clipped signals). Setting this control in a range of 26%-60% of maximum may produce various overdriven sounds (e.g., sounds that are moderately saturated with clipped signals). Setting this control in a range of 61%-100% of maximum may produce various distorted sounds (e.g., sounds that are heavily saturated with clipped signals). With settings in this range, the effect may be a desirable rich distortion and dynamic feel that responds well to low and high output pickups and soft and aggressive playing techniques (e.g., sharp and smooth attack envelopes on sounds forming the input signal).

In some embodiments, the amplifier 700 includes a tone stack module 730. In certain embodiments, the tone stack module 730 is communicatively coupled with a control (e.g., a switch) for selecting among multiple modes. For example, one embodiment includes a single-pull, triple-throw switch 732 for toggling between two modes. One mode of the tone stack module 730 is configured to mimic a standard tone stack (e.g., that of a Marshall™ amplifier). This may allow a performer (e.g., in a cover band) to reproduce sounds created by players that use the mimicked, or a similar-sounding, amplifier.

Notably, typical tone stacks often generate an output signal that is bass-heavy, mid-weak and high-heavy. For example, some stock Marshall™ tone stacks generate an output signal that manifests a three- to six-decibel dip at around one kilohertz. Many sound engineers and performers compensate for this effect using post-processing techniques, like outboard graphic equalizers, or mid-heavy speakers, to equalize the sound. For example, the signal may be amplified to bring the mid-range up to a desired level, and the low-range and high-range faders (or properties of the speaker) may then be used to counteract the effects of the tone stack. However, increasing the volume across the spectrum may also increase the noise floor and/or cause other undesirable effects. It will be appreciated that by switching the tone stack module 730 shown in FIGS. 14A and 14C to a second mode, frequencies around 1 kilohertz are amplified without significantly affecting the tonal qualities at low- and high-range frequencies.

Figure 15:
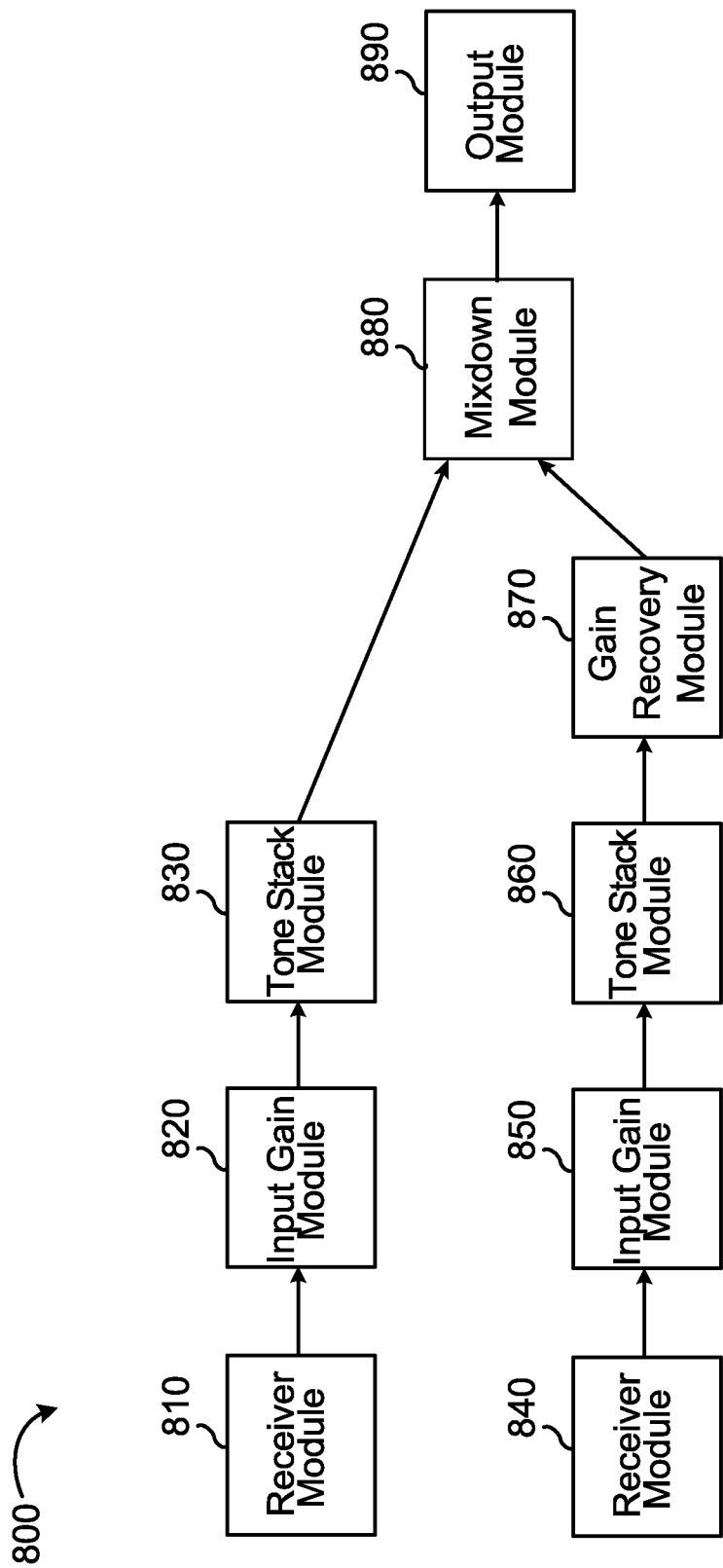
FIG. 15 shows components of another amplifier system in accordance with an exemplary embodiment of the present invention.

As shown in FIG. 15, embodiments of the amplifier 800 may include multiple receiver modules 810 and 840, multiple gain modules 820 and 850, multiple tone stack modules 830 and 860, a gain recovery module 870, a mixdown module 880, and an output module 890. In various embodiments, one or more of these modules may include various analog or digital components, including, for example, vacuum tubes, transistors, and similar components.

Singular or plural audio signals may be received at the amplifier 800 by the receiver modules 810 and 840. The audio signals may typically be amplified separately by the input gain modules 820 and 850 (e.g., acting as a first gain stage that may be controlled at least in part my a volume control, like a volume knob on an amplifier), then processed (e.g., "finished," filtered, voiced, etc.) separately according to a desired tone profile by the tone stack modules 830 and 860. In some embodiments, tone stack modules 830 and 860 may present different processing (e.g., filtering, voicing, etc.) tone profiles. While this may provide multiple voicing options when tailoring the tone, it may also significantly impact the compatibility of the signal levels, dynamic structure and subjective "feel" of the amplifier.

Figure 16A:
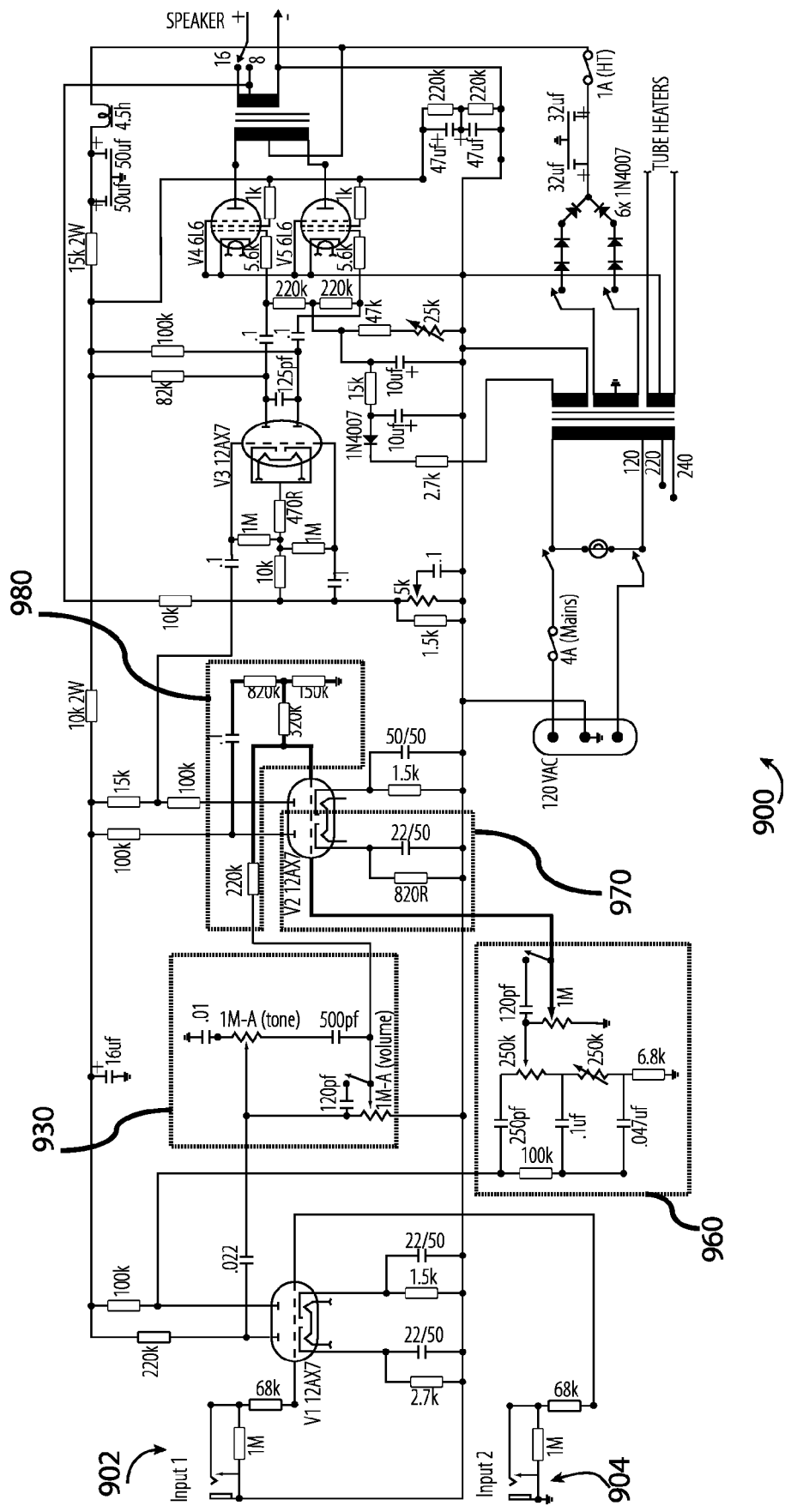
FIG. 16A is a schematic diagram of an amplifier circuit with a mixdown module, in accordance with an exemplary embodiment of the present invention.

FIG. 16A shows a schematic diagram of an amplifier circuit 900, according to various embodiments. The amplifier circuit includes a gain recovery module 970 and a novel mixdown module 980. Singular or plural input signals may be fed into either Input 1 902 or Input 2 904 or both. In one embodiment, the tone stack module 930 differs significantly from 960 (with 930 being simpler in design and possessing a significantly lower insertion loss than 960). It will be appreciated that bringing plural signal paths together (e.g., mixing, summing, etc.) with different impedances and signal strengths may produce an overall poor blend quality or imbalance to the tone and subjective "feel" of each channel, whether utilized simultaneously or individually. It will also be appreciated that each channel's tone and volume controls may interact with the other possibly altering or degrading the sound quality of one or the other, or both channels whether employed independently or simultaneously.

Figure 16B:
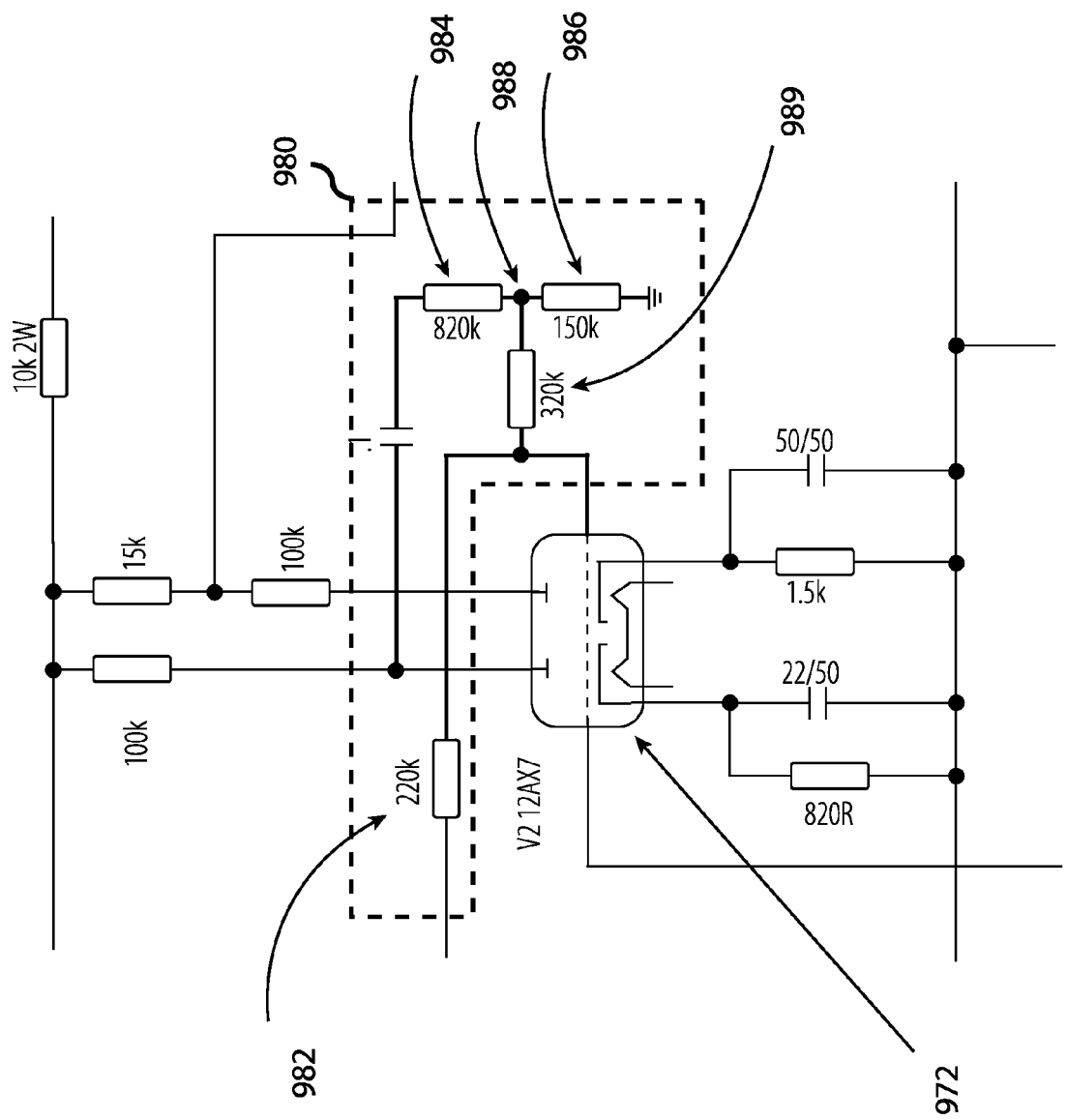
FIG. 16B is a schematic diagram of the mixdown module of FIG. 16A.

In some embodiments, the amplifier 900 includes a gain recovery module 970. In certain embodiments, the gain recovery module 970 is employed to prepare the signal for the mixdown module 980. For example, one embodiment utilizes one half of a typical dual-triode tube 972 as shown in FIG. 16B to provide a reasonable gain factor with regard to the signal preparing it for summing with another signal at the mixdown module 980. This may also provide a circuit buffer or "barrier" between the two channels and somewhat reduce the sympathetic interactions between the two channels.

It will be appreciated that both a mismatch in signal levels, and adverse channel loading and interaction may still exist. For example, the signal level of one channel may be significantly larger than the other such that volume knob adjustments are not able to optimally blend the channels within reasonable balance and with the desired tonal response and subjective "feel." As such, some embodiments include a mixdown module 980. As shown in FIG. 16B, a complex resistor network is included at the point of resolving or summing the signals thus more effectively preparing the newly mixed signal for further processing. Signals originating at Input 1 enter the mixdown module 980 through a 220K resistor 982. Signals originating at Input 2 enter the mixdown module 980 through a voltage divider network that first prepares the signal level for mixdown. The voltage divider network consists of an input resistor valued at 820K 984 connected in series with a 150K resistor 986 terminating at ground. The middle point, or junction of the voltage divider network located at the point of series connection, provides the optimal level of signal originating at Input 2 904. Signals originating at Input 2 are finally summed with signals that originate at Input 1 through a 320K resistor 989. The effect of this asymmetrical summing resistor network (982 and 989) working in conjunction with the preceding voltage divider network may substantially tame the sympathetic interactions between the two channels and deliver a rich tonal quality and dynamic feel that responds well to low and high output pickups and soft and aggressive playing techniques when employing one or the other, or both, amplifier channels.

Thus, it should be understood that the embodiments and examples described herein have been chosen and described in order to best illustrate the principles of the invention and its practical applications to thereby enable one of ordinary skill in the art to best utilize the invention in various embodiments and with various modifications as are suited for particular uses contemplated. Even though specific embodiments of this invention have been described, they are not to be taken as exhaustive. There are several variations that will be apparent to those skilled in the art.

What is claimed is:

1. A speaker enclosure, comprising:
    a speaker enclosure frame forming comprising three sides arranged in an isosceles or equilateral triangle shape in cross-section, wherein:
        two or more of interior intersection angles where the three sides would intersect of the triangle shape are acute angles, and
        two or more of the three sides of the speaker enclosure frame have a same height where they would intersect so as to form an isosceles triangle in cross-section;
    a front baffle panel at least partially closing a front end of the speaker enclosure frame;
    a back baffle panel at least partially closing a back end of the speaker enclosure frame;
    one or more openings in the front and/or back panels;
    one or more loudspeakers mounted to the one or more openings;
    one or more handles attached to the speaker enclosure;
    a sound-deadening material covering some or all of the internal surface of the speaker enclosure frame; and
    one or more locking members to fasten or lock the speaker enclosure to another speaker enclosure such that sides of the speaker enclosure frame of the same height mate together to releasably-hold multiple speaker enclosures together in a repeating geometric pattern.

2. The speaker enclosure of claim 1, wherein the front baffle panel, or back baffle panel, or both, form the same triangular shape as the speaker enclosure frame in cross-section.

3. The speaker enclosure of claim 2, further comprising one or more triangular ports in the back baffle panel, the front baffle panel, or both.

4. The speaker enclosure of claim 3, further comprising a lid for at least one of the triangular ports.

5. The speaker enclosure of claim 1, further comprising one or more corner members attached to the speaker enclosure frame at one or more corners of the triangular shape.

6. The speaker enclosure of claim 1, wherein the openings are three circles spaced equidistant from the center point of the front baffle panel.

7. The speaker enclosure of claim 1, wherein the openings comprise a circle in the center of the front baffle panel.

8. The speaker enclosure of claim 7, further comprising three circular openings spaced outside the center circle at points equidistant from the center of the center circle.

9. The speaker enclosure of claim 1, further comprising an exterior enclosure shell, wherein the speaker enclosure frame is contained within the exterior enclosure shell to form an isolated speaker chamber within the speaker enclosure frame, and one or more other isolated non-speaker spaces within the exterior enclosure shell.

10. The speaker enclosure of claim 9, further comprising an amplifier contained within one or more of the isolated non-speaker spaces.

11. The speaker enclosure of claim 10, wherein the amplifier comprises at least one input gain module, and at last one tone stack module.

12. The speaker enclosure of claim 1, wherein:
    the speaker enclosure is rectangular,
    the speaker enclosure frame is located within the rectangular outline of the speaker enclosure, and
    the speaker enclosure frame is a polygon in cross-section where one or more corners of the triangle shape are cut-off with an additional side of the polygon.

13. A speaker enclosure, comprising:
    a speaker enclosure frame comprising a first side aligned with a first plane, a second side aligned with a second plane and a third side aligned with a third plan, the first, second and third planes forming a triangular shape in cross-section, wherein:
        two or more of the interior angles of the triangular shape are acute angles, and
        two or more sides of the triangular shape have a same height so as to form an isosceles triangle in cross-section;
    a front baffle panel at least partially closing a front end of the speaker enclosure frame;
    a back baffle panel at least partially closing a back end of the speaker enclosure frame;
    one or more openings in the front and/or back panels;
    one or more ports in the back baffle panel and/or the front baffle panel;
    one or more loudspeakers mounted to the one or more openings; a sound-deadening material covering some or all of the internal surface of the speaker enclosure frame; and
    one or more locking members to fasten or lock the speaker enclosure to another speaker enclosure such that sides of the speaker enclosure frame of the same height mate together to releasably-hold multiple speaker enclosures together in a repeating geometric pattern.

14. The speaker enclosure of claim 13, further wherein some or all of the internal surface of the speaker enclosure frame is covered with a sound-deadening material.

15. The speaker enclosure claim 13, further comprising one or more handles attached to the speaker enclosure.

16. The speaker enclosure of claim 13, further comprising locking members to fasten or lock the speaker enclosure to another speaker enclosure.

17. A speaker enclosure as recited in claim 13, wherein at least two of the three sides of the speaker enclosure frame have a same height so as to form an isosceles and/or equilateral triangle in cross-section.

18. The speaker enclosure of claim 13, wherein the openings are three circles spaced equidistant from the center point of the front baffle panel.

19. The speaker enclosure of claim 13, wherein the openings comprise a circle in the center of the front baffle panel.

20. The speaker enclosure of claim 19, further comprising three circular openings spaced outside the center circle at points equidistant from the center of the center circle.

21. The speaker enclosure of claim 13, further comprising an exterior enclosure shell, wherein the speaker enclosure frame is contained within the exterior enclosure shell to form an isolated speaker chamber within the speaker enclosure frame, and one or more other isolated non-speaker spaces within the exterior enclosure shell.

22. The speaker enclosure of claim 21, further comprising an amplifier contained within one or more of the isolated non-speaker spaces.

23. The speaker enclosure of claim 22, wherein the amplifier comprises at least one input gain module, and at last one tone stack module.

24. The speaker enclosure of claim 13, wherein:
the speaker enclosure is rectangular,
the speaker enclosure frame is located within the rectangular outline of the speaker enclosure, and
the speaker enclosure frame is a polygon in cross-section where one or more corners of the triangle shape are cut-off with an additional side of the polygon.

25. A speaker enclosure, comprising:
a speaker enclosure frame comprising a first side aligned with a first plane, a second side aligned with a second plane and a third side aligned with a third plan, the first, second and third planes forming a triangular shape in cross-section, wherein:
two or more of the interior angles of the triangular shape are acute angles, and
two or more sides of the triangular shape have a same height so as to form an isosceles triangle in cross-section;
a front baffle panel at least partially closing a front end of the speaker enclosure frame;
a back baffle panel at least partially closing a back end of the speaker enclosure frame;
one or more openings in the front and/or back panels;
one or more ports in the back baffle panel and/or the front baffle panel; a sound-deadening material covering some or all of the internal surface of the speaker enclosure frame; and
one or more engagement members of the speaker enclosure configured to engage the speaker enclosure to another speaker enclosure such that the one or more sides of the speaker enclosure mate together to releasable-hold multiple speaker enclosures together in a repeating geometric pattern.

26. The speaker enclosure of claim 25, wherein:
the speaker enclosure is rectangular,
the speaker enclosure frame is located within the rectangular outline of the speaker enclosure, and
the speaker enclosure frame is a polygon in cross-section where one or more corners of the triangle shape are cut-off with an additional side of the polygon.

* * * * *

UNITED STATES PATENT AND TRADEMARK OFFICE
CERTIFICATE OF CORRECTION

PATENT NO. : 8,699,743 B2
APPLICATION NO. : 12/838102
DATED : April 15, 2014
INVENTOR(S) : Charles Edward Moomey Page 1 of 1

It is certified that error appears in the above-identified patent and that said Letters Patent is hereby corrected as shown below:

On the Title Page:

Item (73), regarding the spelling of the Assignee:

Delete the word "Amplication"; and
    Insert the word --Amplification--

In the Claims:

In Claim 13, line 44:

Delete the word "plan"; and
    Insert the word --plane--

In Claim 25, line 7:

Delete the word "plan"; and
    Insert the word --plane--

In Claim 25, line 27:

Delete the phrase "releasable-hold"; and
    Insert the phrase --releasably-hold--

Signed and Sealed this
First Day of July, 2014

Michelle K. Lee
*Deputy Director of the United States Patent and Trademark Office*

UNITED STATES PATENT AND TRADEMARK OFFICE
CERTIFICATE OF CORRECTION

PATENT NO. : 8,699,743 B2  
APPLICATION NO. : 12/838102  
DATED : April 15, 2014  
INVENTOR(S) : Charles Edward Moomey Page 1 of 1

It is certified that error appears in the above-identified patent and that said Letters Patent is hereby corrected as shown below:

On the Title Page:

Item (73), regarding the spelling of the Assignee:

Delete the word "Amplication"; and  
    Insert the word --Amplification--

In the Claims:

In Column 10, Claim 13, line 44:

Delete the word "plan"; and  
    Insert the word --plane--

In Column 12, Claim 25, line 7:

Delete the word "plan"; and  
    Insert the word --plane--

In Column 12, Claim 25, line 27:

Delete the phrase "releasable-hold"; and  
    Insert the phrase --releasably-hold--

This certificate supersedes the Certificate of Correction issued July 1, 2014.

Signed and Sealed this  
Fifth Day of August, 2014

Michelle K. Lee  
*Deputy Director of the United States Patent and Trademark Office*